United States Patent
Shin et al.

(10) Patent No.: US 8,873,328 B2
(45) Date of Patent: Oct. 28, 2014

(54) NONVOLATILE MEMORY DEVICE INCLUDING SUDDEN POWER OFF DETECTION CIRCUIT AND SUDDEN POWER OFF DETECTION METHOD THEREOF

(71) Applicant: Samsung Electronics Co., Ltd., Suwan-si (KR)

(72) Inventors: Yong Shik Shin, Hwaseong-si (KR); Yunseok Yang, Hwaseong-si (KR); Oh-Seong Kwon, Hwaseong-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/037,544

(22) Filed: Sep. 26, 2013

(65) Prior Publication Data

US 2014/0146603 A1    May 29, 2014

(30) Foreign Application Priority Data

Nov. 23, 2012 (KR) .......................... 10-2012-0133551

(51) Int. Cl.
| | | |
|---|---|---|
| G11C 11/00 | (2006.01) | |
| G11C 11/14 | (2006.01) | |
| G11C 5/14 | (2006.01) | |
| G11C 11/16 | (2006.01) | |

(52) U.S. Cl.
CPC .................................. *G11C 11/1697* (2013.01)
USPC ............................ 365/228; 365/158; 365/171

(58) Field of Classification Search
USPC ......................................................... 365/228
See application file for complete search history.

(56) References Cited

U.S. PATENT DOCUMENTS

| | | | |
|---|---|---|---|
| 5,392,438 A | | 2/1995 | Gunji |
| 5,892,705 A | * | 4/1999 | Chung ........................... 365/145 |
| 5,943,257 A | * | 8/1999 | Jeon et al. ...................... 365/145 |
| 6,340,902 B1 | * | 1/2002 | Kato ................................ 327/77 |
| 7,372,723 B1 | * | 5/2008 | Lu et al. ......................... 365/158 |
| 7,441,085 B2 | | 10/2008 | Chen |
| 7,558,107 B2 | * | 7/2009 | Sakurai et al. ............ 365/185.02 |
| 8,806,271 B2 | * | 8/2014 | Yong et al. ....................... 714/14 |
| 2002/0033720 A1 | | 3/2002 | Ikehashi et al. |
| 2009/0002900 A1 | * | 1/2009 | Chiu ................................. 361/1 |

(Continued)

FOREIGN PATENT DOCUMENTS

| | | |
|---|---|---|
| JP | 11-045855 | 2/1999 |
| JP | 2001-057074 | 2/2001 |

(Continued)

*Primary Examiner* — Son Mai
(74) *Attorney, Agent, or Firm* — Muir Patent Consulting, PLLC

(57) ABSTRACT

A nonvolatile memory device includes a memory cell array comprising memory cells connected to bit lines and word lines; a word line decoder configured to apply word line voltages to the word lines; a bit line selector configured to select at least one bit line of the bit lines; a control logic configured to control the word line decoder and the bit line selector so that write data is programmed in the memory cell array; and a sudden power off (SPO) detection circuit, wherein the SPO detection circuit comprises: a sensing cell; a first driver configured to provide a first voltage to the sensing cell; and a second driver configured to provide a second voltage to the sensing cell, wherein a program state of the sensing cell becomes different depending on an order or a time difference between the first driver and the second driver being powered off.

20 Claims, 15 Drawing Sheets

(56) References Cited

U.S. PATENT DOCUMENTS

| | | |
|---|---|---|
| 2010/0082890 A1 | 4/2010 | Heo et al. |
| 2010/0146333 A1 | 6/2010 | Yong et al. |
| 2011/0093650 A1 | 4/2011 | Kwon et al. |
| 2011/0099325 A1 | 4/2011 | Roh et al. |
| 2011/0115540 A1 | 5/2011 | Kamp |
| 2011/0119017 A1 | 5/2011 | Kamp et al. |

FOREIGN PATENT DOCUMENTS

| | | |
|---|---|---|
| KR | 930008258 B1 | 8/1993 |
| KR | 10-2002-0023115 A | 3/2002 |
| KR | 10-2010-0039179 A | 4/2010 |

* cited by examiner

NONVOLATILE MEMORY DEVICE INCLUDING SUDDEN POWER OFF DETECTION CIRCUIT AND SUDDEN POWER OFF DETECTION METHOD THEREOF

CROSS-REFERENCE TO RELATED APPLICATIONS

This U.S. non-provisional patent application claims priority under 35 U.S.C. §119 of Korean Patent Application No. 10-2012-0133551, filed on Nov. 23, 2012, the entire contents of which are hereby incorporated by reference.

BACKGROUND

This disclosure relates to semiconductor memory devices, and more particularly, to a nonvolatile memory device including a sudden power off detection circuit.

A semiconductor memory device is classified into a volatile memory device and a nonvolatile memory device. A volatile memory device has a high read/write speed but loses its stored data when its power is interrupted. A nonvolatile memory device retains its stored data even when its power is interrupted. Thus, a nonvolatile memory device is used to store data that should be preserved regardless of whether or not a power is supplied.

A semiconductor memory device is supplied with power from an internal or external power supply. If power is suddenly cut off from the power supply (hereinafter this is referred to as a sudden power off), a fatal defect such as data being erroneously programmed in a semiconductor memory device may occur. As a result of the sudden power off, the semiconductor memory device may be damaged.

Various technical methods for solving problems due to the sudden power off have been suggested. To correctly apply those technical methods, when a sudden power off occurs, a sudden power off detection circuit (hereinafter it is referred to as a SPO detection circuit) for sensing the sudden power off may be used. To improve performance of the semiconductor memory device, there is a growing need for developing a more effective sudden power off detection circuit.

SUMMARY

One example embodiment includes a nonvolatile memory device which comprises a memory cell array comprising a plurality of memory cells connected to a plurality of bit lines and a plurality of word lines; a word line decoder configured to apply word line voltages to the plurality of word lines; a bit line selector configured to select at least one bit line of the plurality of bit lines; a control logic configured to control the word line decoder and the bit line selector so that write data is programmed in the memory cell array; and a sudden power off (SPO) detection circuit. The SPO detection circuit comprises: a sensing cell; a first driver configured to provide a first voltage to the sensing cell; and a second driver configured to provide a second voltage to the sensing cell, wherein a program state of the sensing cell becomes different depending on an order or a time difference between the first driver and the second driver being powered off.

In example embodiments, when sudden power off occurs in the nonvolatile memory device, the first driver and the second driver are sequentially powered off at time intervals shorter than reference time or are powered off at the same time.

In example embodiments, when normal power off occurs in the nonvolatile memory device, the first driver and the second driver are sequentially powered off at time intervals longer than the reference time In example embodiments, when the sudden power off occurs, the sensing cell is programmed to a first program state and when the normal power off occurs, the sensing cell is programmed to a second program state different from the first program state.

In example embodiments, the SPO detection circuit further comprises at least one comparison cell which is programmed to the first program state or the second program state by a control of the first driver and the second driver, wherein the SPO detection circuit is configured to compare program states of the sensing cell and the comparison cell and to judge whether the nonvolatile memory device is suddenly powered off or not according to the comparison result.

In example embodiments, the SPO detection circuit further comprises a delay unit connected between the first driver and the sensing cell and configured to delay a voltage transfer from the first driver to the sensing cell; wherein the SPO detection circuit configured to judge whether the nonvolatile memory device is suddenly powered off according to a program state of the sensing cell.

In example embodiments, the sensing cell comprises a memory device; and a switch transistor serially connected to one end of the memory device.

In example embodiments, the memory device comprises a first magnetic layer; a second magnetic layer; and a tunnel junction layer inserted between the first and second magnetic layers.

In example embodiments, the first voltage is applied to a gate terminal of the switch transistor and the second voltage is applied to the other end of the memory device.

In example embodiments, the nonvolatile memory device further comprises a first logic controlling the first driver to change a level of the first voltage; and a second logic controlling the second driver to change a level of the second voltage.

In example embodiments, the first logic is included in the word line decoder and the second logic is included in the bit line selector.

In example embodiments, the sensing cell is included in the memory cell array.

In another embodiment, a sudden power off detection method is provided for a nonvolatile memory device including a sudden power off (SPO) detection circuit comprising a sensing cell storing sensing data, a first driver providing a first voltage to the sensing cell, and a second driver providing a second voltage to the sensing cell. The method includes receiving a sudden power off detection command; reading out the sensing data from the SPO detection circuit in response to the sudden power off detection command; and judging whether sudden power off occurs or not according to the sensing data read out. A value of the sensing data depends on the order or a time difference between the first and second drivers being powered off, In example embodiments, the SPO detection circuit further comprises at least one comparison cell, wherein judging whether sudden power off occurs or not comprises comparing whether data stored in the comparison cell is identical to the sensing data; and judging whether sudden power off occurs or not according to the comparison result.

In example embodiments, the SPO detection method further comprises delaying a voltage transfer from the first driver to the sensing cell using a delay unit, and judging whether sudden power off occurs or not according to a value of the sensing data.

In another embodiment, a nonvolatile memory device includes: a memory cell array comprising a plurality of memory cells connected to a plurality of bit lines and a plurality of word lines; a word line decoder configured to apply word line voltages to the plurality of word lines; a bit line selector configured to select at least one bit line of the plurality of bit lines; a control logic configured to control the word line decoder and the bit line selector so that write data is programmed in the memory cell array; and a sudden power off (SPO) detection circuit. The SPO detection circuit is configured to: set itself to a first state when a normal power off occurs, and set itself to a second state different from the first state when a sudden power off occurs.

In example embodiments, the SPO detection circuit includes a first input for receiving a first signal from a first voltage source and a second input for receiving a second signal from a second voltage source, the normal power off includes reducing the voltage applied at the first input and reducing the voltage applied at the second input in a controlled manner, and the sudden power off includes reducing the voltage applied at the first input and reducing the voltage applied at the second input in an uncontrolled manner.

In example embodiments, the first state occurs when at least a predetermined amount of time passes between the voltage applied at the first input being reduced and the voltage applied at the second input being reduced; and the second state occurs when less than the predetermined amount of time passes between the voltage applied at the first input being reduced and the voltage applied at the second input being reduced.

In example embodiments, the SPO detection circuit comprises: a sensing cell; a first driver configured to provide a first voltage to the sensing cell; and a second driver configured to provide a second voltage to the sensing cell. Further, the sensing cell may comprise: a memory device; and a switch transistor serially connected to one end of the memory device.

In example embodiments, the memory device comprises: a first magnetic layer; a second magnetic layer; and a tunnel junction layer inserted between the first and second magnetic layers.

BRIEF DESCRIPTION OF THE FIGURES

Various embodiments will be described below in more detail with reference to the accompanying drawings. The disclosure may, however, be embodied in different forms and should not be constructed as limited to the embodiments set forth herein. Like numbers refer to like elements throughout.

DETAILED DESCRIPTION OF THE EMBODIMENTS

Figure 1:
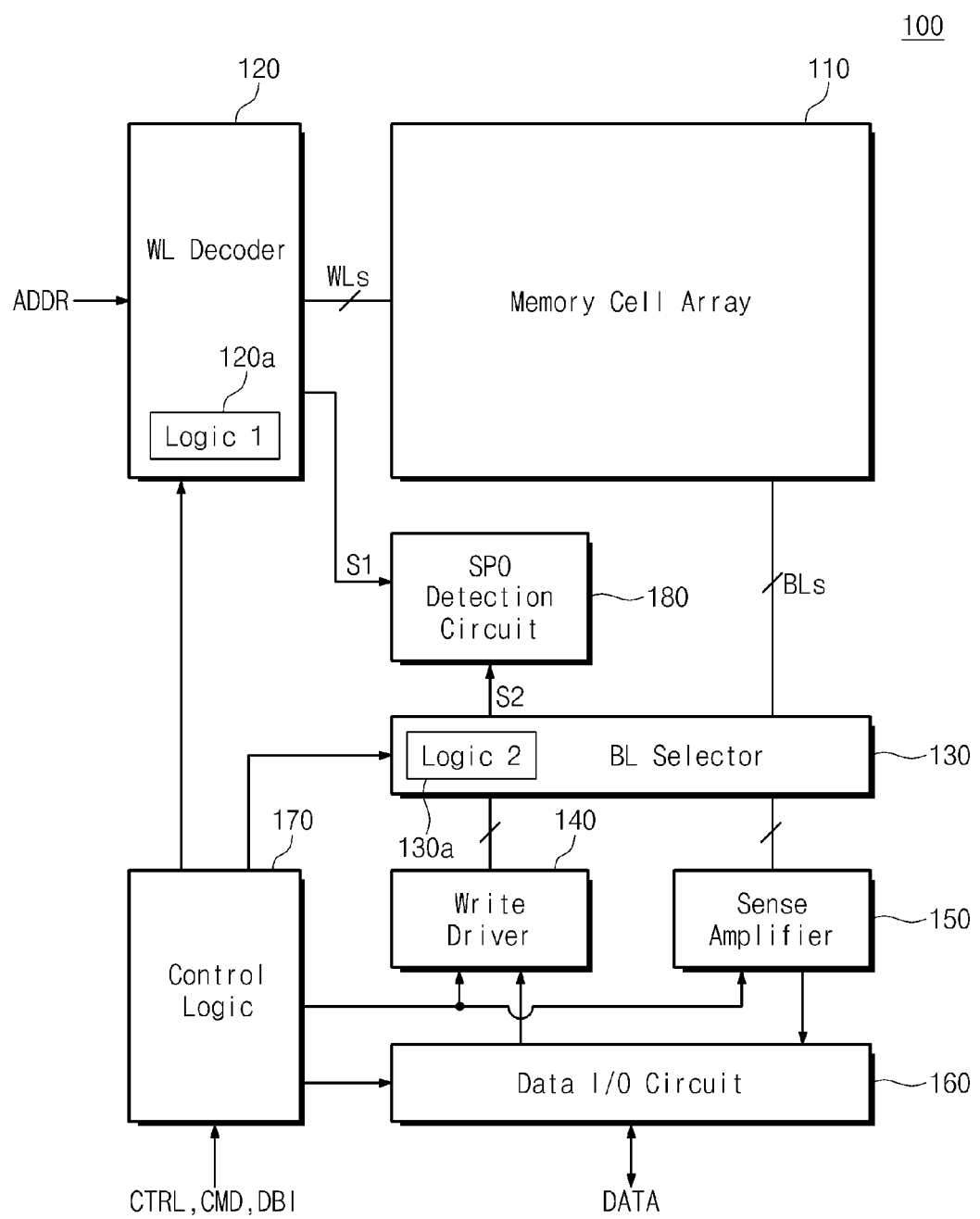
FIG. 1 is a block diagram illustrating an exemplary nonvolatile memory device in accordance with some embodiments.

Various embodiments will be described more fully hereinafter with reference to the accompanying drawings. This inventive concept may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram illustrating an exemplary nonvolatile memory device in accordance with some embodiments. Referring to FIG. 1, the nonvolatile memory device 100 includes a memory cell array 110, a word line decoder 120, a bit line selector 130, a write driver 140, a sense amplifier 150, a data input/output circuit 160, a control logic 170 and a SPO detection circuit 180.

The memory cell array 110 is connected to the word line decoder 120 through word lines WLs and is connected to the bit line selector 130 through bit lines BLs. The memory cell array 110 includes a plurality of memory cells. In example embodiments, memory cells arranged in a row direction are connected to the word lines WLs. Memory cells arranged in a column direction are connected to the bit lines BLs. Each of memory cells included in the memory cell array 110 corresponds to one word line WL and one bit line BL. Each of memory cells included in the memory cell array 110 can store one or more bits according to a voltage or a current being applied to the word line WL and the bit line BL.

As an illustrative embodiment, memory cells of the memory cell array 110 may be a magnetic random access memory (MRAM) cell array.

The word line decoder 120 is connected to the memory cell array 110 through the word lines WLs. The word line decoder 120 is configured to operate in response to a control of the control logic 170. The word line decoder 120 is configured to receive an address ADDR from an external device, and then decode a row address. Using the decoded row address, the word line decoder 120 may select the word lines WLs.

As an illustrative embodiment, the word line decoder 120 may include a first logic 120a controlling the SPO detection circuit 180 using a first signal S1. The first logic, as well as the second logic described below, may include, for example, transistors and other circuitry typically used to implement logic gates and logic circuits.

The bit line selector 130 is connected to the memory cell array 110 through the bit lines BLs and is connected to the write driver 140 and the sense amplifier 150. The bit line selector 130 selects the bit lines BLs in response to a control of the control logic 170.

As an illustrative embodiment, the bit line selector 130 may include a second logic 130a controlling the SPO detection circuit 180 using a second signal S2.

In a program operation, the bit line selector 130 connects the bit lines BLs to the write driver 140. In a read operation, the bit line selector 130 connects the bit lines BLs to the sense amplifier 150.

The write driver 140 operates according to a control of the control logic 170. The write driver 140 is configured to program memory cells connected to bit lines selected by the bit line selector 130 and a word line selected by the word line decoder 120. The write driver 140 can generate a set current or a reset current according to data being received from the data input/output circuit 160 to output the set current or the reset current to the selected bit lines.

The sense amplifier 150 operates according to a control of the control logic 170. The sense amplifier 150 is configured to read memory cells connected to bit lines selected by the bit line selector 130 and a word line selected by the word line decoder 120. The sense amplifier 150 can sense a current flowing through the selected bit lines or a voltage applied to the selected bit lines to read memory cells. The sense amplifier 150 can output the read data to the data input/output circuit 160.

The data input/output circuit 160 operates according to a control of the control logic 170. The data input/output circuit 160 can transfer data being received from the outside to the write driver 140 and output data being received from the sense amplifier 150 to the outside.

The control logic 170 can control an overall operation of the nonvolatile memory device 100. The control logic 170 can operate in response to a command CMD and a control signal CTRL being received from the outside.

The SPO detection circuit 180 stores sensing data representing whether sudden power off occurs or not according to the first and second signals S1 and S2. When power being supplied to the nonvolatile memory device 100 is cut off (hereinafter it is referred to as a normal power off) by a normal control of a power supply system (e.g., in a controlled manner), the first and second signals S1 and S2 being provided to the SPO detection circuit 180 are sequentially cut off at regular time intervals. On the other hand, when the nonvolatile memory device 100 is suddenly powered off (e.g., in an uncontrolled manner), the first and second signals S1 and S2 being provided to the SPO detection circuit 180 are cut off at the same time or at very short time intervals. At this time, the SPO detection circuit 180 stores different data as sensing data depending on the order and a time interval that the first and second signals S1 and S2 are cut off. After that, by a control of the control logic 170 or an external controller (not shown), data stored in the SPO detection circuit 180 is read out.

According to the readout sensing data, the nonvolatile memory device 180 judges whether sudden power off occurs or not.

According to the constitution described above, sudden power off of the nonvolatile memory device 100 may be detected. Since the nonvolatile memory device 100 detects occurrence of the sudden power off independently from a host or an external controller, load of the host or the external controller may be reduced.

Figure 2:
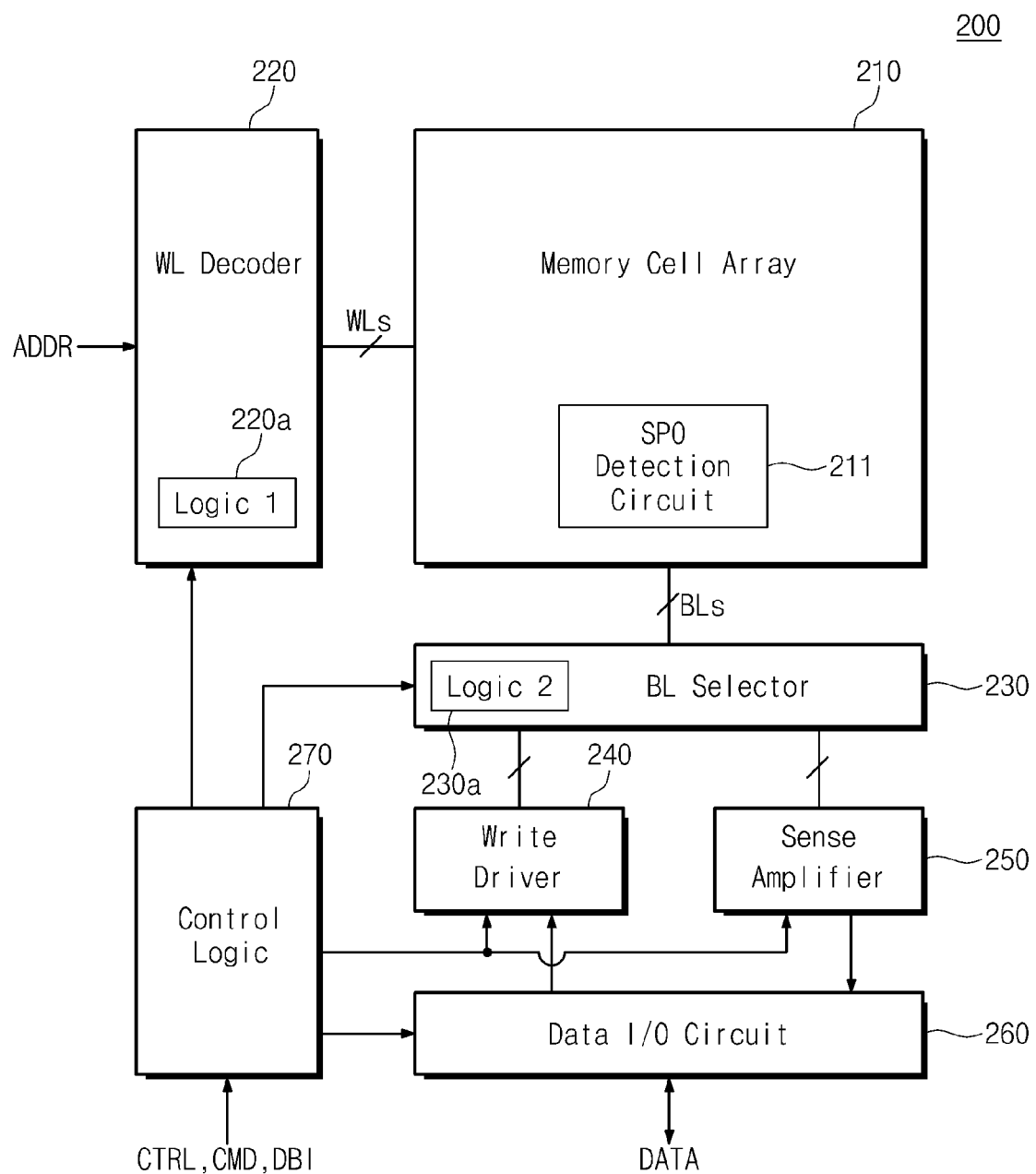
FIG. 2 is a block diagram illustrating an exemplary nonvolatile memory device in accordance with some other embodiments.

FIG. 2 is a block diagram illustrating an exemplary nonvolatile memory device in accordance with some other embodiments. Referring to FIG. 2, the nonvolatile memory device 200 includes a memory cell array 210, a word line decoder 220, a bit line selector 230, a write driver 240, a sense amplifier 250, a data input/output circuit 260, a control logic 270 and a SPO detection circuit 211.

In the present embodiment, the memory cell array 210 includes the SPO detection circuit 211. For example, the memory cell array 210 includes a spare area (not shown). The SPO detection circuit 211 may include a spare area of the memory cell array 210. In one embodiment, the SPO detection circuit 211 includes a sensing cell for storing sensing data. The SPO detection circuit 211 can use a memory cell in the spare area of the memory cell array 210 as a sensing cell.

The SPO detection circuit 211 is controlled by a first logic 220a and a second logic 230a. Control signals being provided by the first logic 220a and the second logic 230a are included a word line signal WLs and a bit line signal BLs respectively to be transmitted to the SPO detection circuit 211. The control signals being provided by the first logic 220a and the second logic 230a may be transmitted to the SPO detection circuit 211 through a separate signal line (not shown) distinguished from the word line signal WLs and the bit line signal BLs.

In one embodiment, all components other than the aforementioned descriptions are the substantially same as the embodiments described in FIG. 1. For example, the descriptions of constitution and operation of the memory cell array 110, the word line decoder 120, the bit line selector 130, the write driver 140, the sense amplifier 150, the data input/output circuit 160 and the control logic 170 illustrated in FIG. 1 can be equally applied to the memory cell array 210, the word line decoder 220, the bit line selector 230, the write driver 240, the sense amplifier 250, the data input/output circuit 260 and the control logic 270 of FIG. 2.

Figure 3:
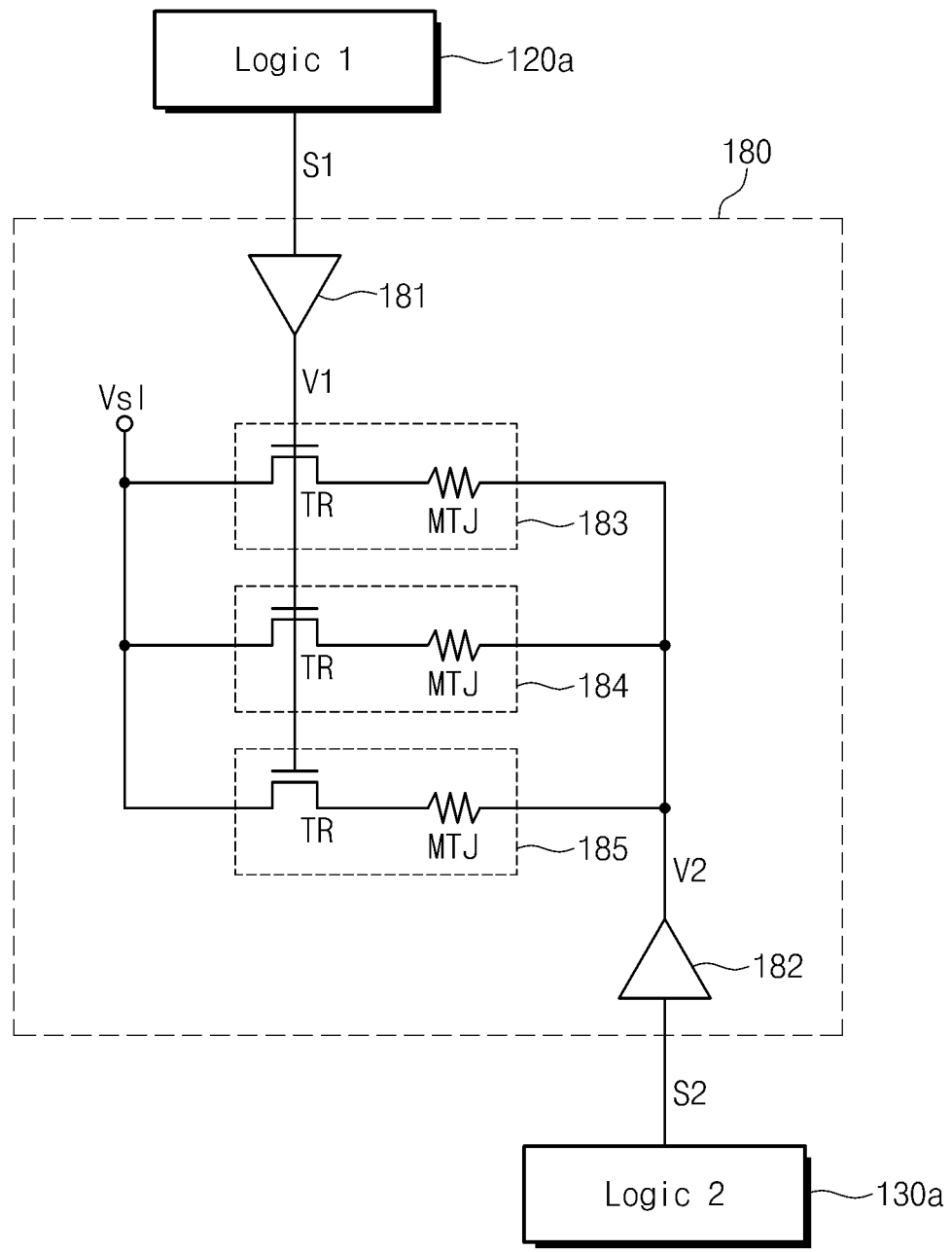
FIG. 3 is a circuit diagram illustrating an exemplary embodiment of a SPO detection circuit illustrated in FIG. 1.

FIG. 3 is a circuit diagram illustrating an exemplary embodiment of an SPO detection circuit illustrated in FIG. 1. Referring to FIG. 3, the SPO detection circuit 180 includes a first driver 181, a second driver 182 and a plurality of memory cells 183, 184 and 185.

Each of the memory cells 183, 184 and 185 includes at least one switch transistor TR and at least one magnetic tunnel junction (MTJ). One end (e.g., a drain terminal) of the switch transistor TR is serially connected to one end of the magnetic tunnel junction (MTJ). A source voltage Vsl is applied to the other end (e.g., a source terminal) of the switch transistor TR.

A first driver 181 provides a gate voltage V1 to the switch transistors TR included in the memory cells 183, 184 and 185 according to a control of a first logic 120a.

A second driver 182 provides a program voltage V2 to the magnetic tunnel junctions MTJ included in the memory cells 183, 184 and 185 according to a control of a second logic 130a. The memory cells 183, 184 and 185 are programmed by a voltage difference between the program voltage V2 and the source voltage Vsl.

At least one memory cell among the memory cells 183, 184 and 185 operates as a sensing cell storing sensing data. At least one memory cell among the memory cells 183, 184 and 185 operates as a comparison cell for comparison with a sensing cell. Here, it is assumed that the memory cell 183 operates as a sensing cell and the memory cells 184 and 185 operate as a comparison cell.

When sudden power off occurs, first data is programmed in the sensing cell 183 and when normal power off occurs, second data different from the first data is programmed in the sensing cell 183. When either sudden power off or normal power off occurs, the same data is programmed in the comparison cells 184 and 185.

Thus, the nonvolatile memory device 100 can judge whether sudden power off occurs or not by reading a program state of the sensing cell 183 and comparing the program state of the sensing cell 183 and program state of the comparison cells 184 and 185.

An exemplary detailed operation method of the SPO detection circuit 180 is described in FIGS. 4 through 9.

Figure 4:
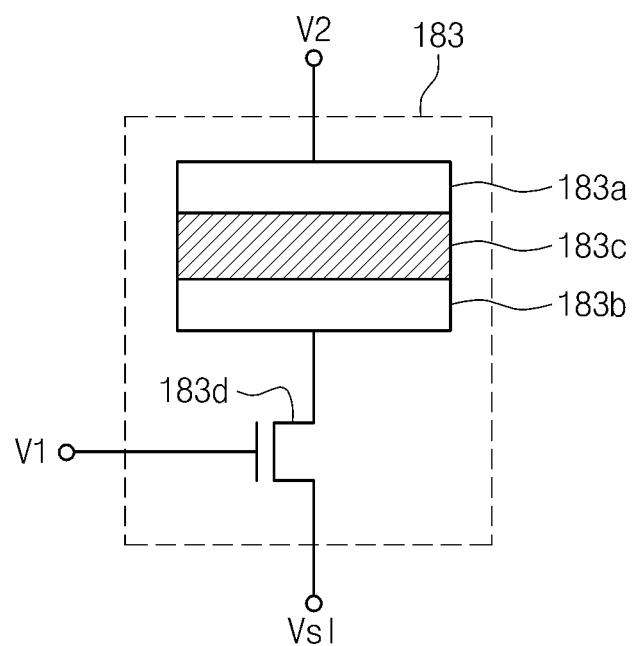
FIG. 4 is a drawing illustrating an exemplary structure of memory cells illustrated in FIG. 3.

FIG. 4 illustrates an exemplary structure of memory cells illustrated in FIG. 3, according to one embodiment. Here, it is assumed that the memory cells 183, 184, and 185 are MRAM cells. A MRAM is a memory storing a magnetic polarization state in a thin film of magnetic material and performs a write operation by changing a magnetic polarization state by a magnetic field generated according to a bit line current or a word line current. In one embodiment, a structure of the memory cells 183, 184, and 185 is the same. Since this structure of the memory cells 183, 184 and 185 is the same, only a structure of the sensing cell 183 is described as an example.

Referring to FIG. 4, the sensing cell 183 includes a magnetic tunnel junction (MTJ) including a fixed magnetic layer 183a, a free magnetic layer 183b, and a tunnel junction layer 183c, and a switch transistor 183d.

In one embodiment, the fixed magnetic layer 183a has a thickness relatively greater than the free magnetic layer 183b and thereby when a strong magnetic field is applied, a magnetic polarization state of the fixed magnetic layer 183a may be changed. A magnetic polarization state of the free magnetic layer 183b may be changed by a relatively small magnetic field.

The tunnel junction layer 183c is located between the fixed magnetic layer 183a and the free magnetic layer 183b to separate the fixed magnetic layer 183a and the free magnetic layer 183b.

The fixed magnetic layer 183a and the free magnetic layer 183b are made of a material such as NiFeCo or CoFe. The tunnel junction layer 183c is made of a material such as MgO or $AlO_3$.

The sensing cell 183 which includes the sequentially stacked free magnetic layer 183b, the tunnel magnetic layer 183c and the fixed magnetic layer 183a has a different electrical resistance value depending on a magnetization direction of the fixed magnetic layer 183a and the free magnetic layer 183b. In the case that a magnetization direction of the fixed magnetic layer 183a and the free magnetic layer 183b is the same (hereinafter referred to as an equilibrium state), the sensing cell 183 has a relatively low resistance value. In the case that a magnetization direction of the fixed magnetic layer 183a is opposite to a magnetization direction of the free magnetic layer 183b (hereinafter referred to as a non-equilibrium state), the sensing cell 183 has a relatively high resistance value.

The switch transistor 183d may be turned on or turned off depending on a level of a gate voltage V1. In a program operation, the sensing cell 183 is activated or inactivated by turn-on or turn-off of the switch transistor 183d. If the switch transistor 183d is turned on, a program current may flow through the sensing cell 183. A program state of the sensing cell 183 may change depending on a direction and a level of a program current (or, a program voltage) being applied to the sensing cell 183. If the switch transistor 183d is turned off, a program current does not flow through the sensing cell 183. Thus, even if applying a high program voltage V2 to the sensing cell 183, a program state of the sensing cell 183 does not change.

Figure 5:
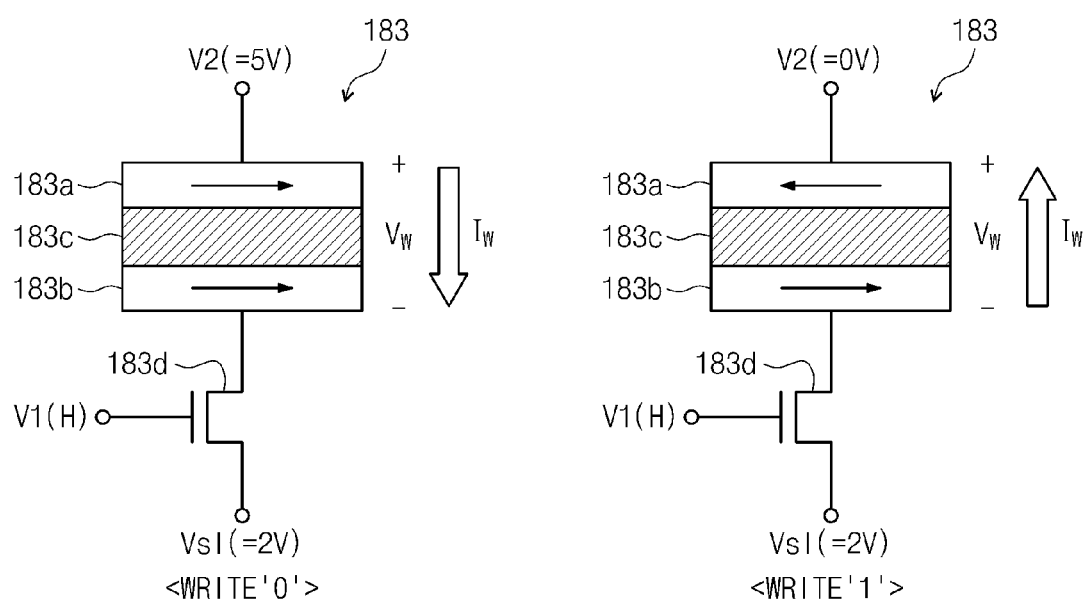
FIG. 5 is a drawing illustrating an exemplary method in which data is programmed in a sensing cell illustrated in FIG. 4.

FIG. 5 illustrates an exemplary method in which data is programmed in a sensing cell of FIG. 4. Referring to FIG. 5, a method of programming '0' bit or '1' bit in the sensing cell 183 is illustrated.

In a program operation, the nonvolatile memory device 100 can program '0' bit or '1' bit in a memory cell by magnetizing the sensing cell 183 to an equilibrium state or a non-equilibrium state.

In a '0' write operation (WRITE '0'), the nonvolatile memory device 100 can make a magnetization direction of the free magnetic layer 183b equal to that of the fixed magnetic layer 183a by applying the program voltage V2 and the source voltage Vsl to the sensing cell 183 so that a program current Iw of forward direction (a direction from a drain to a source) flows through the sensing cell 183 (equilibrium state). The equilibrium state means that '0' bit is programmed in the sensing cell 183 and in the equilibrium state, the sensing cell 183 has a relatively low resistance value.

In a '1' write operation (WRITE '1'), the nonvolatile memory device 100 can make a magnetization direction of the free magnetic layer 183b opposite to that of the fixed magnetic layer 183a by applying the program voltage V2 and the source voltage Vsl to the sensing cell 183 so that a program current Iw of reverse direction (a direction from a source to a drain) flows through the sensing cell 183 (non-equilibrium state). The non-equilibrium state means that '1' bit is programmed in the sensing cell 183 and in the non-equilibrium state, the sensing cell 183 has a relatively high resistance value.

An aspect of example embodiments of a method for programming the sensing cell 183 will be more fully described below. In one embodiment, if a voltage of 2V or more is applied to both ends of the sensing cell 183, it is assumed that the sensing cell 183 is programmed as an equilibrium state or a non-equilibrium state depending on a direction of the program current Iw.

In a '0' write operation, the nonvolatile memory device 100 applies the program voltage V2 of 5V and the source voltage Vsl of 2V. If the switch transistor 183d is turned on by the gate voltage V1, since a program current Iw of forward direction (e.g., in the direction from the layered magnetic and tunnel junction layers toward the switch transistor 183d) flows through the sensing cell 183 and a voltage difference between both ends of the sensing cell 183 is equal to or more than 2V, the sensing cell 183 is programmed to an equilibrium state.

On the contrary, in a '1' write operation, the program voltage V2 is lowered to a ground voltage and the source voltage Vsl retains 2V. If the switch transistor 183d is turned on by the gate voltage V1, since a program current Iw of reverse direction flows through the sensing cell 183 and a voltage difference between both ends of the sensing cell 183 is equal to or more than 2V, the sensing cell 183 is programmed to a non-equilibrium state.

Figure 6:
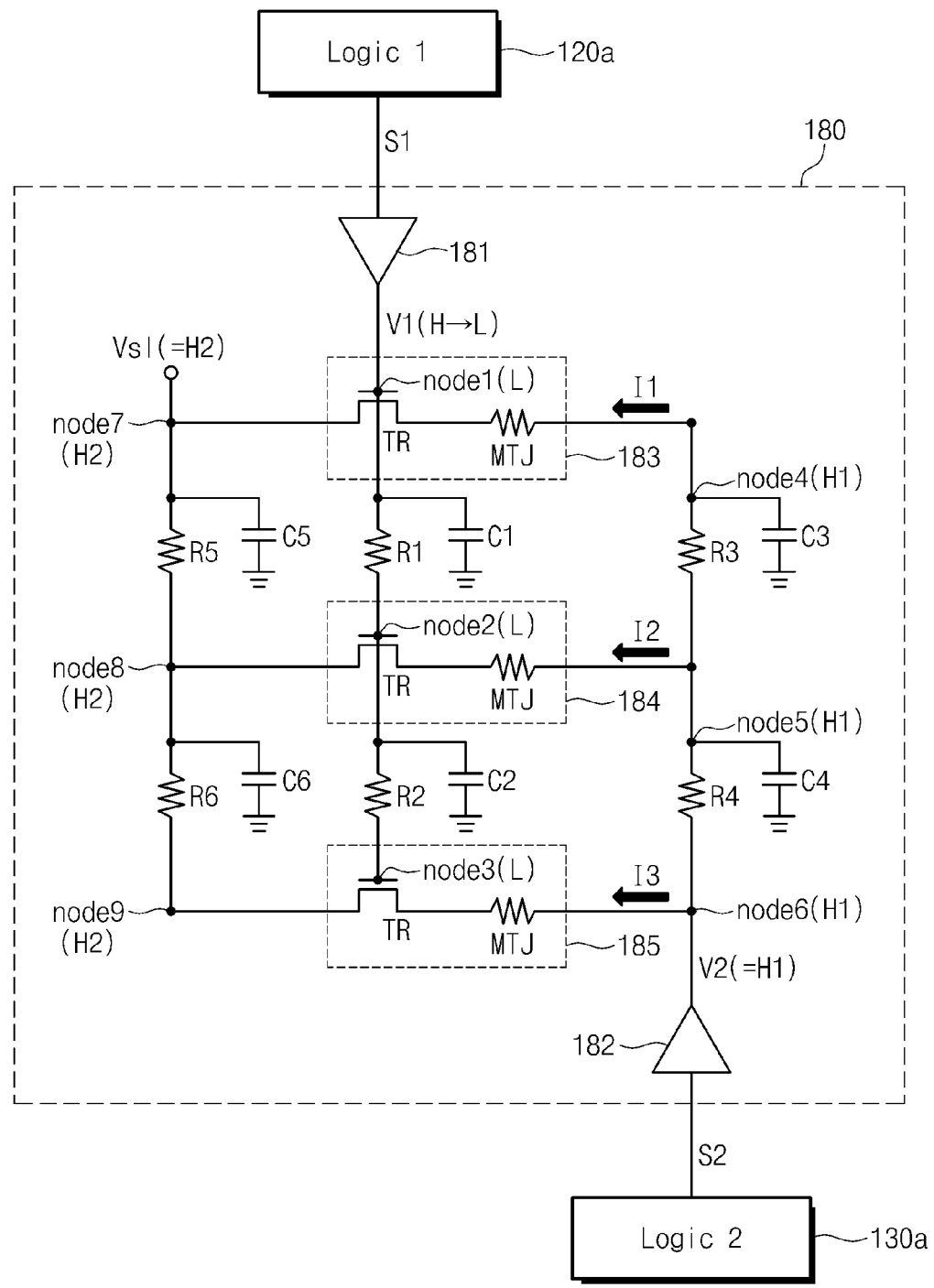
FIG. 6 is a circuit diagram illustrating an exemplary method in which an SPO detection circuit illustrated in FIG. 3 operates in a normal power off condition.

FIG. 6 is a circuit diagram illustrating an exemplary method by which an SPO detection circuit of FIG. 3 operates in a normal power off condition. Referring to FIG. 6, the SPO detection circuit 180 includes the first driver 181, the second driver 182 and the plurality of memory cells 183, 184 and 185. In order to set an actual operation model of the SPO detection circuit 180, in the circuit diagram of FIG. 6, parasitic capacitances and wire resistances are included between nodes 1 through 9.

When the nonvolatile memory device 100 is powered on, the first logic 120a controls the first driver 181 so that a level of the gate voltage V1 being provided to the memory cells 183, 184 and 185 becomes high level (H, e.g., 5V). In example embodiments, when the first signal S1 provided from the first logic 120a is '1' (or a logic level 'high'), the first driver 181 provides the gate voltage V1 of high level (H). When the first signal S1 provided from the first logic 120a is '0' (or a logic level 'low'), the first driver 181 provides the gate voltage V1 of low level (L, e.g., 0V).

When the nonvolatile memory device 100 is powered on, the second logic 130a controls the second driver 182 so that a level of the program voltage V2 being provided to the memory cells 183, 184 and 185 becomes high level (H1, e.g., 7V). In example embodiments, when the second signal S2 provided from the second logic 130a is '1' (or a logic level 'high'), the second driver 182 provides the program voltage V2 of high level (H1). When the second signal S2 provided from the second logic 130a is '0' (or a logic level 'low'), the second driver 182 provides the program voltage V2 of low level (L, e.g., 0V).

When the nonvolatile memory device 100 is powered on, a level of the source voltage Vsl provided to the memory cells 183, 184 and 185 remains high (H2, e.g., 3V).

According to the constitution described above, when the nonvolatile memory device 100 is powered on, the switch transistors TR of the memory cells 183, 184 and 185 are all turned on and a voltage difference between both ends of the memory cells 183, 184 and 185 becomes 4V(7V−3V=4V). Thus, program currents I1, I2 and I3 of forward direction flow through the memory cells 183, 184 and 185 respectively and the memory cells 183, 184 and 185 are programmed to an equilibrium state (or a data '0' storage state).

An operation of the SPO sensing circuit 180 of when the nonvolatile memory device 100 is normally powered off is now described.

When the nonvolatile memory device 100 is normally powered off, the nonvolatile memory device 100 controls the first logic 120a and the second logic 130a so that the first and second drivers 181 and 182 are sequentially powered off at regular time intervals. In one embodiment, the first driver 181 and the second driver 182 being powered off means that a level of the gate voltage V1 provided from the first driver 181 and a level of the program voltage V2 provided from the second driver 182 are lowered to a ground voltage.

However, in an actual circuit model, because of parasitic capacitance and wire resistances that exist between nodes 1, 2 and 3, voltage changes of the nodes 1, 2 and 3 do not occur at once. When the gate voltage V1 is lowered from a high level to a low level (H→L), a voltage level of the node 3 disposed the farthest away from the first driver 181 which is operated as a voltage source is lowered first to a low level L. And then, voltage levels of the node 2 and the node 3 are sequentially lowered to a low level L.

The nonvolatile memory device 100 turns off a power of the first logic 120a. If the first logic 120a is powered off, the first signal S1 becomes '0' (or a logic level 'low'). If the first signal S1 becomes '0', the first driver 181 is also powered off (or a gate voltage V1 becomes a ground voltage).

Considering a voltage change delay between the node 1, the node 2 and the node 3, the nonvolatile memory device 100 waits for a reference time to pass from when the first driver 181 is powered off. At this time, the reference time means the time that takes for a voltage change of the gate voltage V1 to be reflected in the nodes 1, 2 and 3. If the reference time passes from when the first driver 181 is powered off, voltage levels of the nodes 1, 2 and 3 are all changed into a low level (L). If the voltage levels of the nodes 1, 2 and 3 are all changed into a low level (L), the switch transistors TR of the memory cells 183, 184 and 185 are all turned off.

The nonvolatile memory device 100 turns off a power of the second logic 130a after the reference time passes from when the first driver 181 is powered off. If the second logic 130a is powered off, the second signal S2 becomes '0' (or a logic level 'low'). If the second signal S2 becomes '0', the second driver 182 is also powered off (or the program voltage V2 becomes a ground voltage). Even if the program voltage V2 is changed by power off of the second driver 182, since the switch transistors TR of the memory cells 183, 184 and 185 are all turned off, program states of the memory cells 183, 184 and 185 are not changed. Thus, in the case that the nonvolatile memory device 100 is normally powered off, all the memory cells 183, 184 and 185 retain the same program state (e.g., an equilibrium state).

Figure 7:
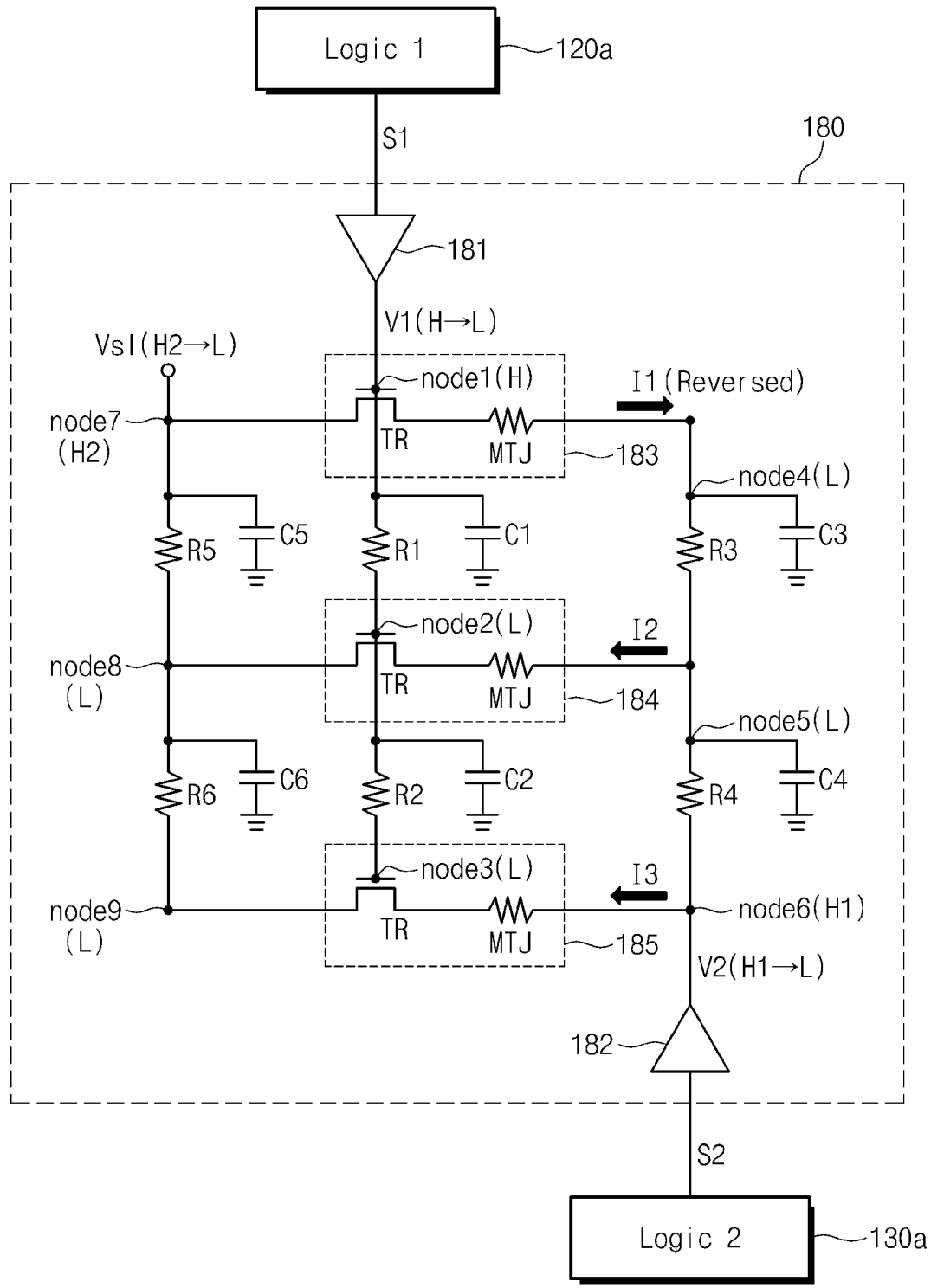
FIG. 7 is a circuit diagram illustrating an exemplary method in which an SPO detection circuit illustrated in FIG. 3 operates in a sudden power off condition.

FIG. 7 is a circuit diagram illustrating an exemplary method by which an SPO detection circuit of FIG. 3 operates in a sudden power off condition. Referring to FIG. 7, the SPO detection circuit 180 includes the first driver 181, the second driver 182 and the plurality of memory cells 183, 184 and 185. In order to set an actual operation model of the SPO detection circuit 180, in the circuit diagram of FIG. 7, parasitic capacitances and wire resistances are included between nodes 1 through 9.

When the nonvolatile memory device 100 is powered on, the gate voltage V1, the program voltage V2 and the source voltage Vsl are provided to the memory cells 183, 184 and 185. Thus, when the nonvolatile memory device 100 is powered on, program currents I1, I2 and I3 of forward direction flow through the memory cells 183, 184 and 185 respectively and the memory cells 183, 184 and 185 are programmed to an equilibrium state (or a data '0' storage state).

An operation of the SPO detection circuit 180 in which the nonvolatile memory device 100 is suddenly powered off is described below.

When the nonvolatile memory device 100 is suddenly powered off, all the constitutions of the nonvolatile memory device 100 are powered off at once. That is, the first logic 120a and the second logic 130a are powered off at the same time. The first driver 181 and the second driver 182 are also powered off at the same time.

As described above, in an actual circuit model, because of a parasitic capacitance and a wire resistance that exist between the nodes 1, 2 and 3, voltage changes of the nodes 1, 2 and 3 do not occur at once. For example, in the case that the gate voltage V1 is lowered from a high level to a low level (H→L), a voltage level of the node 3 disposed at the farthest away from the first driver 181 to which is operated as a voltage source is lowered first to a low level (L). And then, voltage levels of the node 2 and the node 1 are sequentially lowered to a low level (L).

Similarly, because of a parasitic capacitance and a wire resistance that exist between the nodes 4, 5, and 6, voltage changes of the nodes 4, 5, and 6 do not occur at once. A voltage level of the node 4 disposed at the farthest away from the second driver 182 is lowered first to a low level (L). And then, voltage levels of the node 5 and the node 6 are sequentially lowered to a low level (L).

Similarly, because of a parasitic capacitance and a wire resistance that exist between the nodes 7, 8 and 9, a voltage level of the node 4 disposed at the farthest away from a terminal to which is provided the source voltage Vsl is lowered first to a low level (L). And then, voltage levels of the node 8 and the node 7 are sequentially lowered to a low level (L).

Because of that reason described above, in the case in which the nonvolatile memory device 100 is suddenly powered off, the sensing cell 183 among the memory cells 183, 184 and 185 is programmed to have a different program state from the comparison cells 184 and 185.

More specifically, in the case in which the gate voltage V1, the program voltage V2 and the source voltage Vsl are lowered to a ground voltage at the same time by the sudden power off (H→L, H1→L, H2→L), a voltage level of the node which is more close to a voltage source is more slowly changed. Even when electric potentials of the node 8 and node 9 among the nodes 7, 8, and 9 connected to the source voltage Vsl are a ground voltage (L), an electric potential of the node 7 may temporarily become the high level H2. Similarly, even when electric potentials of the node 2 and node 3 among the nodes 1, 2, and 3 connected to the gate voltage V1 are a ground voltage (L), an electric potential of the node 1 may temporarily become the high level H. Similarly, even when electric potentials of the node 4 and node 5 among the nodes 4, 5 and 6 connected to the program voltage V2 are a ground voltage (L), an electric potential of the node 6 may temporarily become the high level H1.

In this case, the switch transistor TR of the sensing cell 183 is turned on and an electric potential of the source-side terminal (node 7) is a high level H2 and an electric potential of the MTJ-side terminal (node 4) is a ground level (L). Thus, a reverse direction current I1 flows through the sensing cell 183 and the sensing cell 183 is programmed to a non-equilibrium state (or a data '1' storage state).

Since electric potentials of the source-side terminals (nodes 8 and 9) of the comparison cells 184 and 185 are higher than electric potentials of the MTJ-side terminals (nodes 5 and 6) of the comparison cells 184 and 185, forward direction currents I2 and I3 flow through the comparison cells 184 and 185 respectively. Electric potentials of the gate terminals of the comparison cells 184 and 185 become a ground electric potential (L) and thereby the switch transistors TR of the comparison cells 184 and 185 are turned off. Thus, an equilibrium state (or a data '0' storage state) of the comparison cells 184 and 185 is maintained.

Therefore, if sudden power off occurs in the nonvolatile memory device 100, the sensing cell 183 and the comparison cells 184 and 185 have different program states from each other. This is contrasted with that in FIG. 6, the sensing cell 184 and the comparison cells 184 and 185 have the same program state.

Thus, the nonvolatile memory device 100 can read out program states of the sensing cell 183 and the comparison cells 184 and 185 to judge whether sudden power off occurs or not. If the sensing cell 183 and the comparison cells 184 and 185 have the same program state, the nonvolatile memory device 100 judges that sudden power off did not occur. If the sensing cell 183 and the comparison cells 184 and 185 have different program states from each other, the nonvolatile memory device 100 judges that sudden power off has occurred.

The description above is only an example embodiment, and the nonvolatile memory device 100 can judge whether sudden power off occurs from data stored in the SPO sensing circuit 180 using various methods. If a program state of the sensing cell 183 is an equilibrium state (or a data '0' storage state), the nonvolatile memory device 100 judges that the sensing cell 183 is normally powered off and if a program state of the sensing cell 183 is a non-equilibrium state (or a data '1' storage state), the nonvolatile memory device 100 judges that the sensing cell 183 is suddenly powered off.

It is assumed that voltage levels of the gate voltage V1, the program voltage V2 and the source voltage Vsl are lowered to a ground level at the same time by sudden power off. However, that is one example embodiment, and the inventive concept can be applied to a case where voltage levels of the gate voltage V1 and the program voltage V2 are sequentially lowered to a ground level at time intervals shorter than a reference time by sudden power off. Here, the reference time means the time that takes for a voltage change of the gate voltage V1 to be reflected in the nodes 1, 2 and 3. Even in this case, an electric potential of MTJ-side terminal (node 4) of the sensing cell 183 is a ground level (L) but electric potentials of the gate-side terminal (node 1) and the source-side terminal (node 7) may be high levels H1 and H2. Thus, a reverse direction program current flows through the sensing cell 183 and the sensing cell 183 may have a different program state from that of when the sensing cell 183 is normally powered off.

According to the constitution described above, the nonvolatile memory device 100 can detect sudden power off of the nonvolatile memory device independently from a host or an external controller. Thus, load of the host or the external controller can be reduced and the nonvolatile memory device 100 can judge more quickly whether sudden power off occurs or not.

Figure 8:
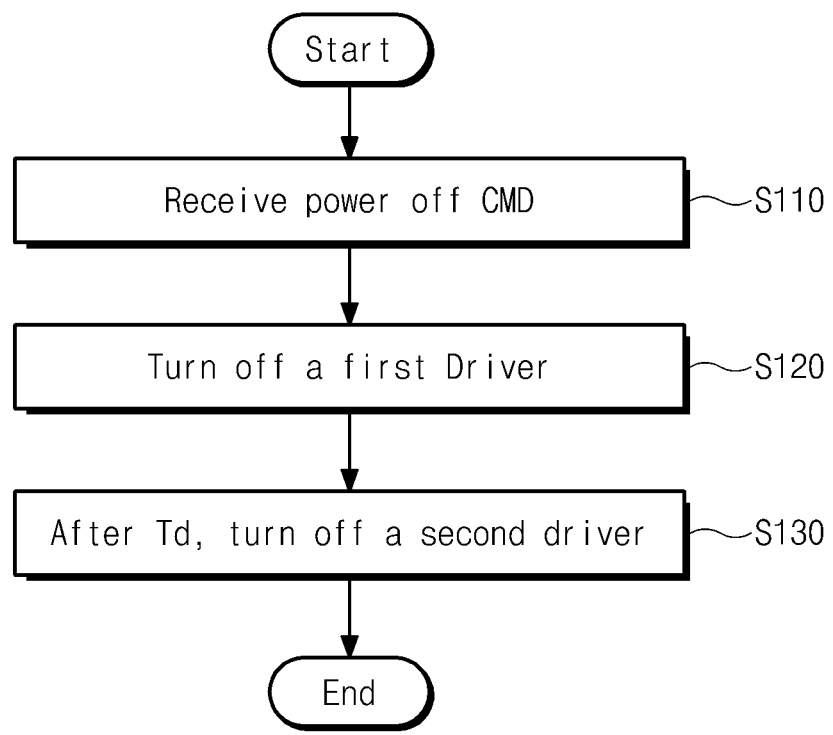
FIG. 8 is a flow chart illustrating an exemplary method in which an SPO detection circuit illustrated in FIG. 6 operates in a normal power off condition.

FIG. 8 is a flow chart illustrating an exemplary method in which an SPO detection circuit of FIG. 6 operates in a normal power off condition. Referring to FIG. 8, an operation method of the SPO detection circuit 180 includes steps S110 through S130.

In a step S110, the nonvolatile memory device 100 receives a power off command. The power off command may be received, for example, from an external controller or a host. In example embodiments, the power off command may also be received from an internal controller (not shown) of the nonvolatile memory device 100.

In a step S120, the nonvolatile memory device 100 turns off a power of the first driver 181. At this time, the nonvolatile memory device 100 can control power off of the first driver 181 through the first logic 120*a*.

In a step S130, the nonvolatile memory device 100 turns off a power of the second driver 182 after reference time Td passes from when the first driver 181 is powered off. In one embodiment, the reference time Td reflects the time that takes for a voltage change of the gate voltage V1 to be reflected in the nodes 1, 2 and 3. In one embodiment, a specific operation of the SPO detection circuit 180 by power off of the second driver 182 is the same as that described in FIGS. 6 and 7.

When the first driver 181 and the second driver 182 are controlled as described above, the memory cells 183, 184 and 185 of the SPO detection circuit 180 are programmed to an equilibrium state (or a data '0' storage state).

As described in FIG. 7, when the nonvolatile memory device 100 is suddenly powered off, a program state of the sensing cell 183 of the SPO detection circuit 180 becomes a non-equilibrium state (or a data '1' storage state).

According to an operation method of the SPO detection circuit 180, the sensing cell 183 may have a different program state depending on whether sudden power off occurs or not.

Figure 9:
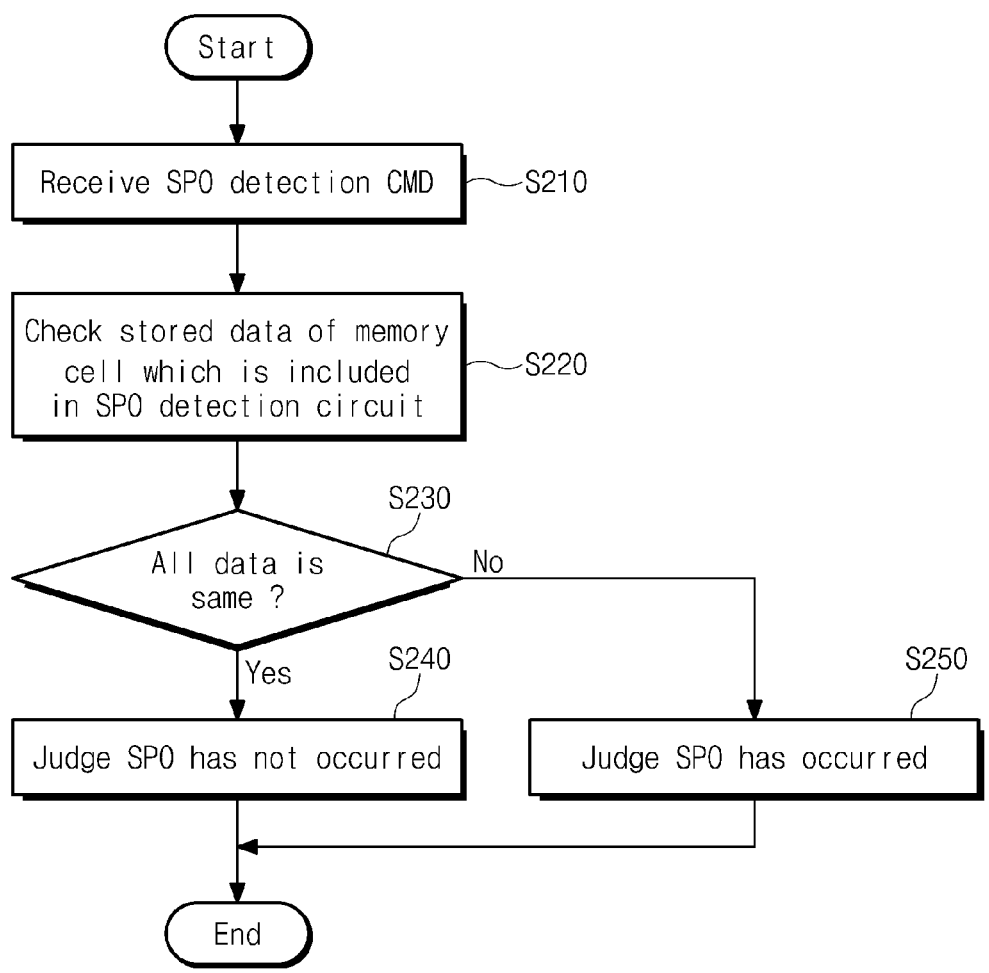
FIG. 9 is a flow chart illustrating an exemplary sudden power off detection method of a nonvolatile memory device in accordance with some exemplary embodiments.

FIG. 9 is a flow chart illustrating an exemplary sudden power off detection method of a nonvolatile memory device in accordance with some embodiments. Referring to FIG. 9, the sudden power off detection method includes steps S210 through S250.

In a step S210, the nonvolatile memory device 100 receives a sudden power off detection command (hereinafter referred to as an SPO detection command). When the nonvolatile memory device 100 is powered-on or rebooted, the SPO detection command may also be received from an external controller or a host. Furthermore, when the nonvolatile memory device 100 is powered-on or rebooted, the SPO detection command may also be received from an internal controller (not shown) of the nonvolatile memory device 100. In exemplary embodiments, the SPO detection command may be generated from software layers as an application, a bootloader, a kernel of OS, etc. In exemplary embodiments, the SPO detection command may be generated from hardware layers as an external signal generator, a memory circuit, etc.

In a step S220, the nonvolatile memory device 100 reads out data stored in the SPO detection circuit 180. The data read out may include sensing data stored in the sensing cell 183 and comparison data stored in the comparison cells 184 and 185. The sensing data and the comparison data represent program states of the sensing cell 183 and the comparison cells 184 and 185 respectively.

In a step S230, the nonvolatile memory device 100 judges whether the data read out are the same. If the data read out are all the same, the sudden power off detection method proceeds to a step S240. If the data read out are not all the same, the sudden power off detection method proceeds to a step S250.

In a step S240, the nonvolatile memory device 100 judges that sudden power off did not occur.

In a step S250, the nonvolatile memory device 100 judges whether sudden power off has occurred.

In one embodiment, after the nonvolatile memory device 100 is powered on, the sudden power off detection method is performed before the first driver 181 and the second driver 182 are powered on. If this does not occur, the memory cells 183, 184 and 185 of the SPO detection circuit 180 are newly programmed to an equilibrium state by a drive of the first driver 181 and the second driver 182.

The nonvolatile memory device 100 can detect sudden power off of the nonvolatile memory device independently from a host or an external controller. Thus, load of the host or the external controller is reduced and the nonvolatile memory device 100 can judge more quickly whether sudden power off occurs or not. In one embodiment, while the nonvolatile memory device 100 retains data related to power-off operation in the normal power-off, the nonvolatile memory device 100 may retain secure data in the sudden power-off. For example, a security problem may arise by the sudden power-off. After step S250, the memory controller may invalidate the data retained in the nonvolatile memory device 100. Accordingly, a security of the nonvolatile memory device may be improved.

Figure 10:
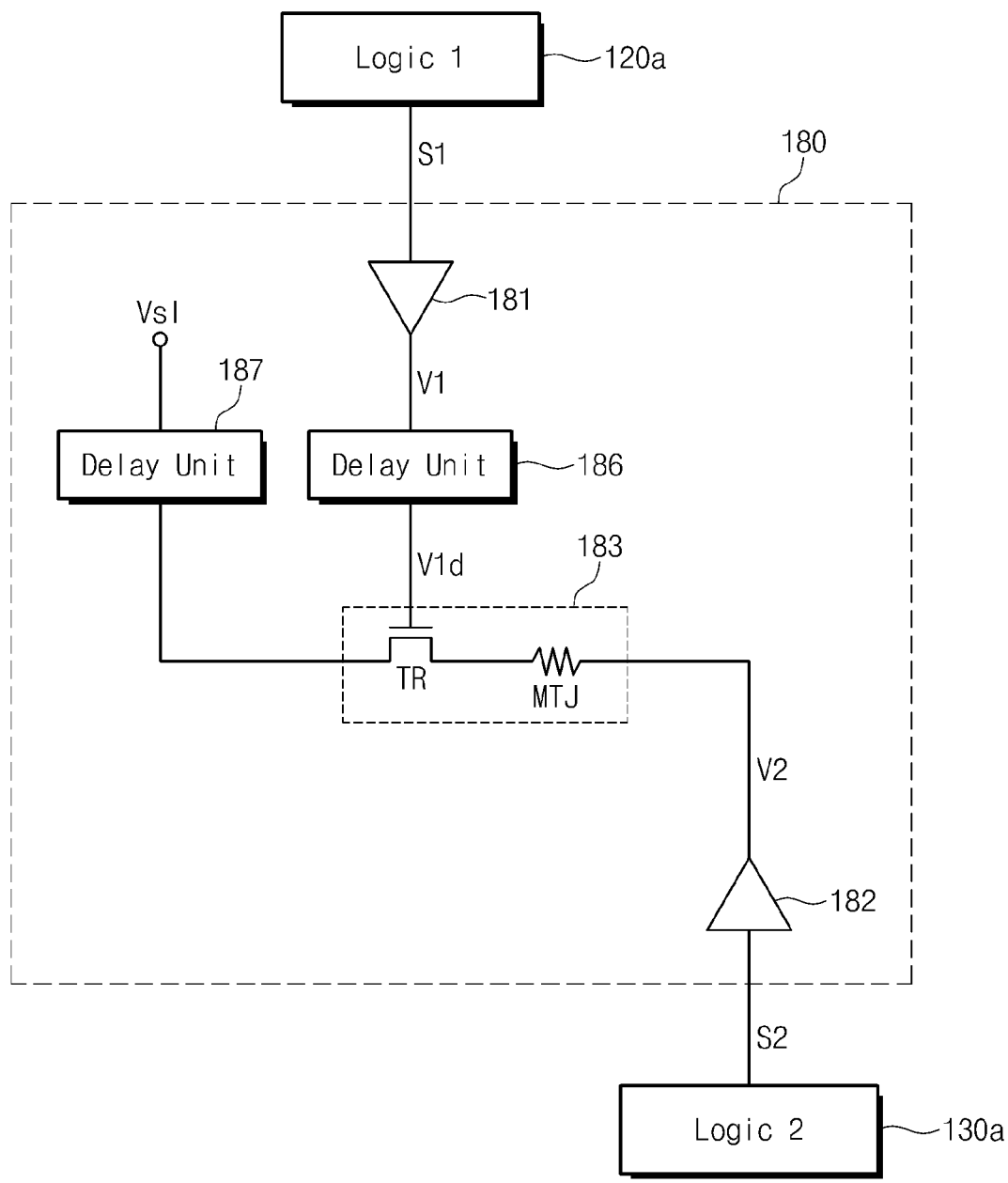
FIG. 10 is a circuit diagram illustrating another exemplary embodiment of an SPO detection circuit illustrated in FIG. 1.

FIG. 10 is a circuit diagram illustrating another exemplary embodiment of an SPO detection circuit illustrated in FIG. 1. The SPO detection circuit 180 includes the first driver 181, the second driver 182, the sensing cell 183 and first and second delay units 186 and 187.

The sensing cell 183 includes at least one switch transistor TR and at least one magnetic tunnel junction MTJ. One end (e.g., a drain terminal) of the switch transistor TR is serially connected to one end of the magnetic tunnel junction MTJ. The other end (e.g., a source-side terminal) of the switch transistor TR is connected to the second delay unit 187.

The first driver 181 provides a drive voltage V1 according to a control of the first logic 120*a*. The drive voltage V1 is provided to the first delay unit 186 and the first delay unit 186 delays the drive voltage V1 to provide the time delayed drive voltage V1 as a gate voltage V1d of the switch transistor TR. For example, the gate voltage V1d of the switch transistor TR is delayed compared to the drive voltage being provided from the first driver 181. The delay may be for a predetermined time.

The second driver 182 provides the program voltage V2 to the magnetic tunnel junction MTJ of the sensing cell 183. As described above, the sensing cell 183 is programmed by a voltage difference between the program voltage V2 and the source voltage Vsl. The source voltage Vsl is delayed by the second delay unit 187 to be provided to the sensing cell 183.

When sudden power off occurs, first data is programmed in the sensing cell 183 and when normal power off occurs, second data different from the first data is programmed in the sensing cell 183.

Thus, the nonvolatile memory device 100 can read out a program state of the sensing cell 183 to judge whether sudden power off occurs or not.

Figure 11:
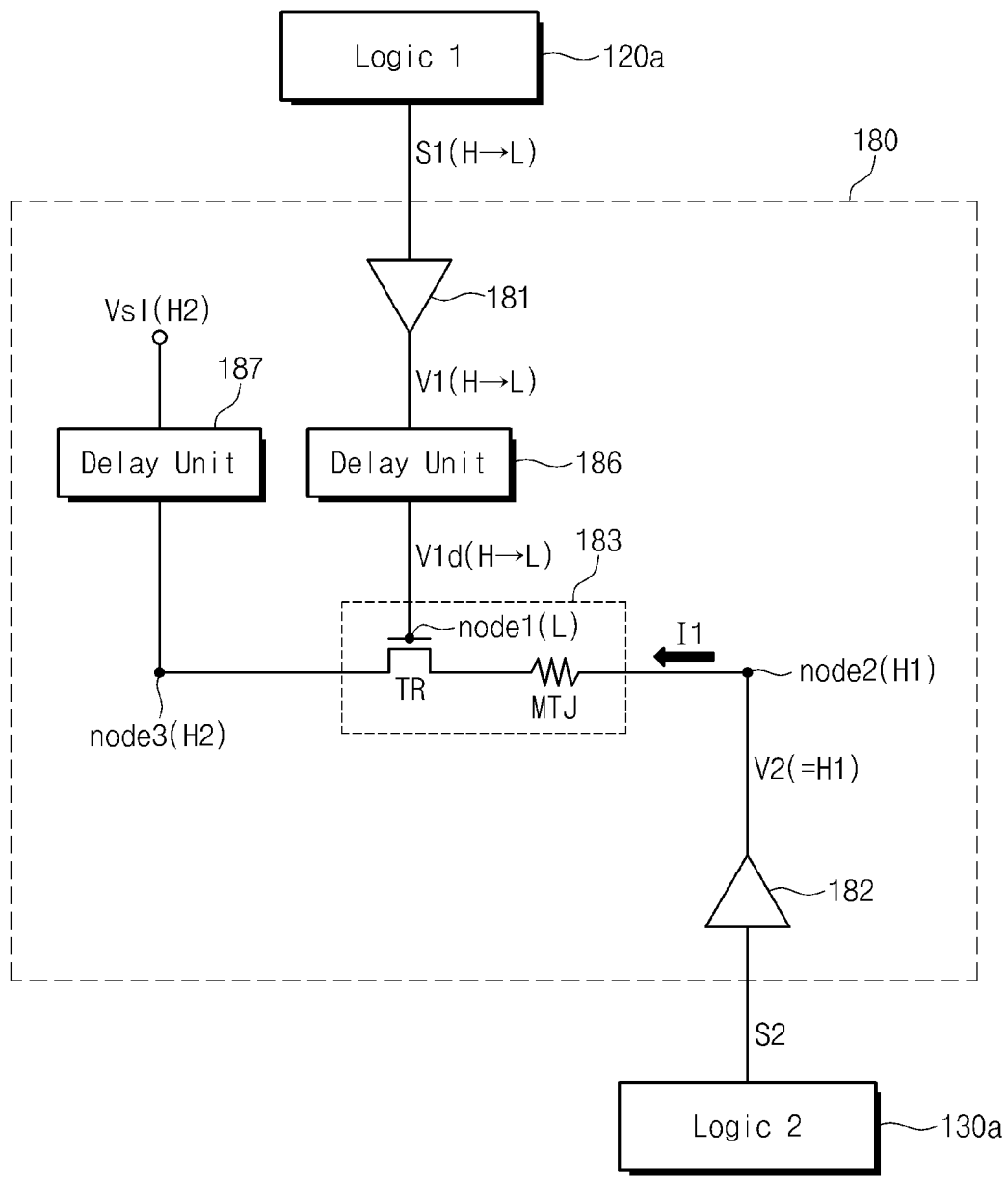
FIG. 11 is a circuit diagram illustrating an exemplary method in which an SPO detection circuit illustrated in FIG. 10 operates in a normal power off condition.
Figure 12:
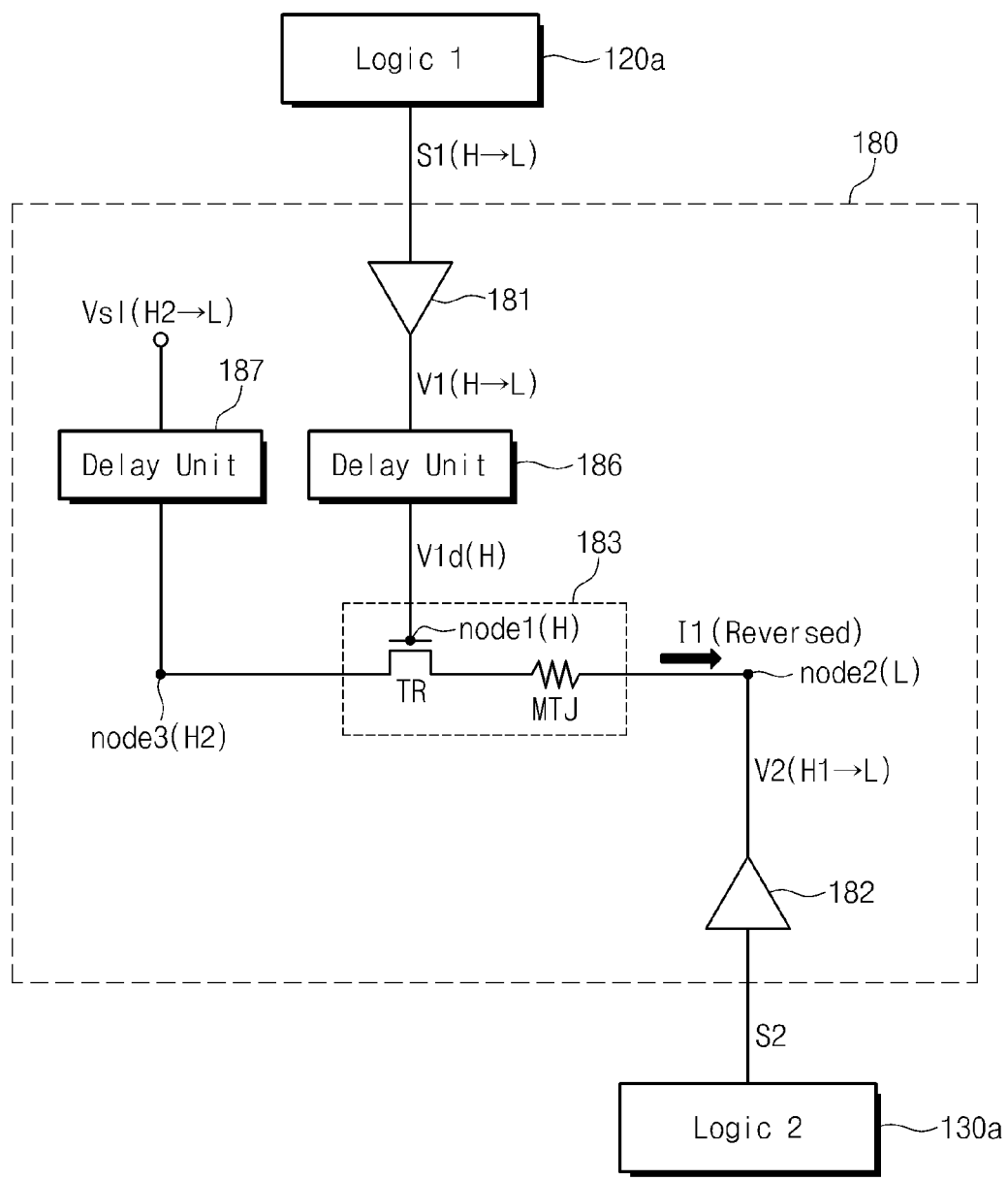
FIG. 12 is a circuit diagram illustrating an exemplary method in which an SPO detection circuit illustrated in FIG. 10 operates in a sudden power off condition.

A specific description of the SPO detection circuit 180 is described in reference to FIGS. 11 and 12.

FIG. 11 is a circuit diagram illustrating an exemplary method by which an SPO detection circuit such as illustrated in FIG. 10 operates in a normal power off condition.

In one embodiment, when the nonvolatile memory device 100 is powered on, the first logic 120a controls the first driver 181 so that a level of the gate voltage V1d provided to the sensing cell 183 becomes high H (e.g., 5V). When a first signal S1 provided from the first logic 120a has '1' (or logic level 'high'), the first driver 181 provides the drive voltage V1 of high level (H). When a first signal S1 provided from the first logic 120a has '0' (or logic level 'low'), the first driver 181 provides the drive voltage V1 of low level (L, e.g., 0V). As described above, the drive voltage V1 is time-delayed by the first delay unit 186 to be provided to a gate terminal of the switch transistor TR.

When the nonvolatile memory device 100 is powered on, the second logic 130a controls the second driver 182 so that a level of the program voltage V2 provided to the sensing cell 183 becomes high H1 (e.g., 7V). When a second signal S2 provided from the second logic 130a has '1' (or logic level 'high'), the second driver 182 provides the program voltage V2 of high level (H1). When a second signal S2 provided from the second logic 130a has '0' (or logic level 'low'), the second driver 182 provides the program voltage V2 of low level (L, e.g., 0V).

When the nonvolatile memory device 100 is powered on, an electric potential of source-side terminal (node 3) is maintained at high level H2 (e.g., 3V). In example embodiments, a voltage applied to the source-side terminal (node 3) is time-delayed, compared to the source voltage Vsl, by the second delay unit 187.

According to the constitution described above, when the nonvolatile memory device 100 is powered on, the switch transistor TR of the sensing cell 183 is turned on and a voltage difference between both ends of the sensing cell 183 becomes 4V (7V−3V=4V). Thus, a program current I1 of a first, forward direction flows through the sensing cell 183 and the sensing cell 183 is programmed to an equilibrium state (or a data '0' storage state).

A specific constitution of the sensing cell 183 may be the same as that described in FIGS. 4 and 5.

An operation of the SPO detection circuit 180 when the nonvolatile memory device 100 is normally powered off is described below.

When the nonvolatile memory device 100 is normally powered off, the nonvolatile memory device 100 controls the first logic 120a and the second logic 130a so that the first driver 181 and the second driver 182 are sequentially powered off at regular distances of time. In one embodiment, the power-off of the first driver 181 and the second driver 182 means that voltage levels of the drive voltage V1 provided by the first driver 181 and the program voltage V2 provided by the second driver 182 are lowered to a ground voltage.

First, the nonvolatile memory device 100 turns off the first logic 120a. If the first logic 120a is powered off, the first signal S1 becomes '0' (or a logic level 'low'). If the first signal S1 becomes '0', the first driver 181 is also powered off (or the drive voltage V1 becomes a ground voltage).

The drive voltage V1 is time-delayed by the first delay unit 186 to be provided to the switch transistor TR.

The nonvolatile memory device 100 waits for a reference time to pass from when the first driver 181 is powered off. The reference time may refer to the time that takes for a voltage change of the drive voltage V1 to be reflected in the gate voltage V1d. For example, the reference time may be a time that takes for the gate voltage V1d to follow a voltage change of the drive voltage V1. In one embodiment, the reference time may be equal to or longer than delay time of the drive voltage V1 by the first delay unit 186.

The nonvolatile memory device 100 turns off the second logic 130a after reference time passes from when the first driver 181 is powered off. If the second logic 130a is powered off, the second signal S2 becomes '0' (or a logic level 'low'). If the second signal S2 becomes '0', the second driver 182 is also powered off (or the program voltage V2 becomes a ground voltage).

Even if the program voltage V2 is changed by power off of the second driver 182, since the switch transistor TR of the sensing cell 183 is turned off, a program state of the sensing cell 183 is not changed. Thus, in the case that the nonvolatile memory device 100 is normally powered off, a program state of the sensing cell 183 retains an equilibrium state (or a data '0' storage state).

FIG. 12 is a circuit diagram illustrating an exemplary operating method for an SPO detection circuit of FIG. 10 in a sudden power off condition.

Like FIG. 11, when the nonvolatile memory device 100 is powered on, the switch transistor TR of the sensing cell 183 is turned on and a voltage difference between both ends of the sensing cell 183 becomes 4V (7V−3V=4V). Thus, a program current I1 of a first, forward direction flows through the sensing cell 183 and the sensing cell 183 is programmed to an equilibrium state (or a data '0' storage state).

A specific constitution of the sensing cell 183 may be the same as that described in FIGS. 4 and 5.

An operation of the SPO detection circuit 180 when the nonvolatile memory device 100 is suddenly powered off is described below.

When the nonvolatile memory device 100 is suddenly powered off, all the constitutions of the nonvolatile memory device 100 are powered off at once. That is, the first logic 120a and the second logic 130a are powered off at the same time. The first driver 182 and the second driver 182 are also powered off at the same time.

As a result, the program voltage V2 applied to the sensing cell 183 is immediately lowered to a ground level (H→L) in concurrence with power off of the second driver 182. However, the gate voltage V1d applied to the sensing cell 183 is the drive voltage V1, which is time-delayed by the first delay unit 186. The gate voltage V1d is lowered to a ground level after a delay time passes from when the first driver 181 is powered off. Thus, even if the program voltage V2 is lowered to a ground level (H→L), the gate voltage V1d temporarily maintains a high level H. Similarly, a voltage applied to a source-side terminal (node 3) of the sensing cell 183 is a voltage which is time-delayed by the second delay unit 187. Thus, even if the source voltage Vsl is lowered to a ground level (H2→L), an electric potential of the source-side terminal (node 3) temporarily maintain a high level H2.

By the reason described above, in the case that the nonvolatile memory device 100 is suddenly powered off, the sensing cell 138 is programmed to have a different program state from that of when the memory device 100 is normally powered off.

In the case where the drive voltage V1, the program voltage V2 and the source voltage Vsl are lowered to a ground level at the same time, electric potentials of the gate-side terminal (node 1) and the source-side terminal (node 3) temporally maintain a high level (H, H2) while an electric potential of the node 2 is a ground level. Thus, since the switch transistor TR of the sensing cell 183 is turned on and an electric potential H2 of the source-side node (node 3) is higher than a voltage level L of the program voltage V2, a program current I1 of a second, reverse direction flows through the sensing cell 183. The sensing cell 183 is programmed to a non-equilibrium state (or a data '1' storage state).

Thus, if a sudden power off occurs in the nonvolatile memory device 100, the sensing cell 183 is programmed to a non-equilibrium state (or a data '1' storage state). This is contrasted with when the sensing cell 183 is programmed to an equilibrium state (or a data '0' storage state) in FIG. 11.

The nonvolatile memory device 100 reads out a program state of the sensing cell 183 to judge whether sudden power off occurs or not. If a program state of the sensing cell 183 is an equilibrium state (or a data '0' storage state), the nonvolatile memory device 100 judges that sudden power off did not occur. If a program state of the sensing cell 183 is a non-equilibrium state (or a data '1' storage state), the nonvolatile memory device 100 judges that sudden power off has occurred.

According to the constitution described above, whether sudden power off has occurred in the nonvolatile memory device may be judged by reading a program state of one sensing cell 183.

The nonvolatile memory device 100 can detect sudden power off of the nonvolatile memory device independently from an external controller or a host. Thus, load of the host or the external controller is reduced and the nonvolatile memory device 100 can judge more quickly whether sudden power off occurs or not.

Figure 13:
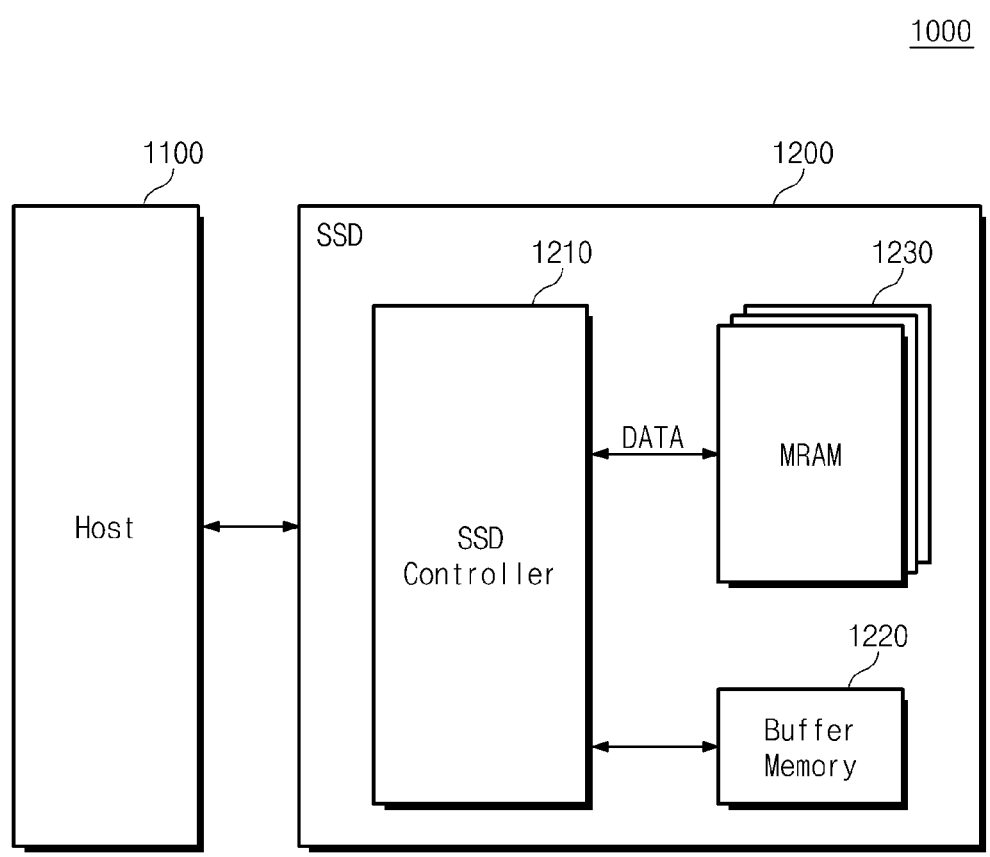
FIG. 13 is a block diagram illustrating an exemplary solid state drive in accordance some embodiments.

FIG. 13 is a block diagram illustrating a solid state drive in accordance some exemplary embodiments. Referring to FIG. 13, a user device 1000 includes a host 1100 and an SSD 1200. The SSD 1200 includes an SSD controller 1210, a buffer memory 1220 and a nonvolatile memory device 1230.

The SSD controller 1210 provides a physical connection between the host 1100 and the SSD 1200. The SSD controller 1210 corresponds to a bus format of the host 1100 to provide an interface with the SSD 1200. The SSD controller 1210 decodes a command being provided from the host 1100. According to a decoded result, the SSD controller 1210 accesses the nonvolatile memory device 1230. Examples of a bus format of the host include a universal serial bus (USB), a small computer system interface (SCSI), a PCI express, an ATA, a parallel ATA (PATA), a serial ATA (SATA), a serial attached SCSI (SAS), etc.

The buffer memory 1220 temporarily stores write data provided from the host 1100 or data read from the nonvolatile memory device 1230. In the case where data that exists in the nonvolatile memory device 1230 is cached when the host 1100 requests a read operation, the buffer memory 1220 supports a cache function of directly providing the cached data to the host 1100. Generally, a data transmission speed by a bus format (for example, SATA or SAS) of the host 1100 is much faster than a transmission speed of a memory channel of the SSD 1200. In the case where an interface speed of the host 1100 is much higher, performance degradation caused by a speed difference may be minimized by providing a large capacity of the buffer memory 1220.

The buffer memory 1220 may be provided by a synchronous DRAM to provide sufficient buffering in the SSD 1200 used as a large capacity of an auxiliary memory device. However, the buffer memory 1220 is not limited thereto.

The nonvolatile memory device 1230 is provided as a storage medium. For example, the nonvolatile memory device 1230 may be provided as a magnetic random access memory (MRAM) having high storage capacity. The nonvolatile memory device 1230 may be constituted by a plurality of memory devices. In this case, each memory device may be connected to the SSD controller 1210 by a channel unit. The nonvolatile memory device 1230 as a storage medium is a MRAM as an illustration but the nonvolatile memory device 1230 may be constituted by other nonvolatile memory devices. For example, a PRAM, a ReRAM, FRAM, a NAND flash memory or a NOR flash memory may be used as a storage medium. A memory system in which different kinds of memory devices are mixed may be applied. The nonvolatile memory device 1230 may be constituted to be the same as the nonvolatile memory devices described in FIG. 1 or FIG. 2.

In the SSD 1200 described above, the nonvolatile memory device 1230 includes an SPO detection circuit sensing sudden power off independently from the SSD controller 1210. For example, the SPO detection circuit may be the same as the SPO detection circuits described in FIG. 3 or FIG. 10. A sensing circuit included in the SPO detection circuit is programmed to have a different program state according to whether sudden power off occurs or not. Thus, the nonvolatile memory device 1230 can judge whether sudden power off occurs or not by reading out a program state of the sensing cell.

Since the nonvolatile memory device 1230 senses sudden power off of the nonvolatile memory device independently from the host or the SSD controller 1210, load of the host or the SSD controller 1210 is reduced and the nonvolatile memory device 1230 can judge more quickly whether sudden power off occurs or not.

Figure 14:
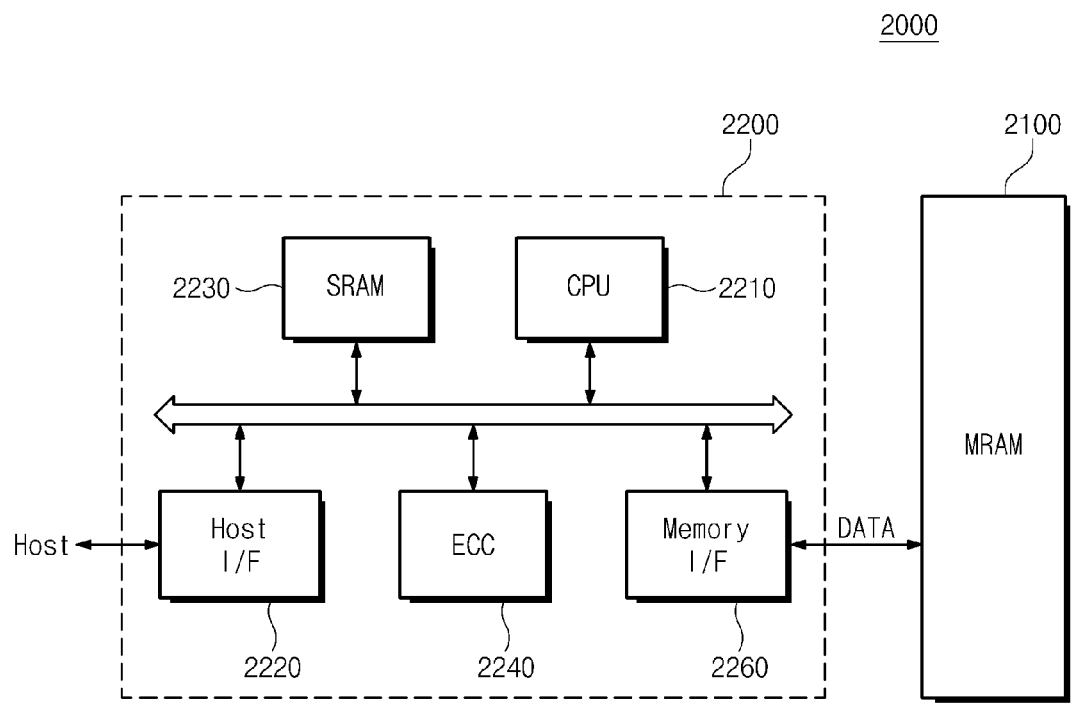
FIG. 14 is a block diagram illustrating an exemplary data storage device in accordance some embodiments.

FIG. 14 is a block diagram illustrating a data storage device in accordance some exemplary embodiments. Referring to FIG. 14, a data storage device 2000 may include a memory controller 2200 and a nonvolatile memory device 2100.

The nonvolatile memory device 2100 may be the same as one of the nonvolatile memory devices described in FIG. 1 or FIG. 2. In one embodiment, the nonvolatile memory device 2100 may be an MRAM device including a plurality of MRAM cells.

The memory controller 2200 may be configured to control the nonvolatile memory device 2100. An SRAM 2239 may be used as a working memory. The host interface 2220 may include data exchange protocols of a host connected to the data storage device 2000. An error correction circuit 2240 included in the memory controller 2200 can detect and correct errors included in data read from the nonvolatile memory device 2100. A memory interface 2260 can interface with the nonvolatile memory device 2100. A CPU 2210 can perform an overall operation for data exchange of the memory controller 2200. Although not illustrated in the drawing, the data storage device 2000 may further include a ROM (not shown) storing code data for an interface with the host.

The memory controller 2200 is configured to communicate with the outside (e.g., host) through one of various interface protocols such as USB, MMC, PCI-E, SAS, SATA, PATA, SCSI, ESDI and IDE.

In the data storage device 2000 described above, the nonvolatile memory device 2100 includes an SPO detection circuit sensing sudden power off independently from the memory controller 2200 and the host. For example, the SPO detection circuit may be the same as the SPO detection circuit described in FIG. 3 or FIG. 10. A sensing circuit included in the SPO detection circuit is programmed to have a different program state according to whether sudden power off occurs or not. Thus, the nonvolatile memory device 2100 can judge whether sudden power off occurs or not by reading out a program state of the sensing cell.

Since the nonvolatile memory device 2100 senses sudden power off of the nonvolatile memory device independently from the host or the memory controller 2200, load of the host or the memory controller 2200 is reduced and the nonvolatile memory device 2100 can judge more quickly whether sudden power off occurs or not.

The data storage device 2000 may be applied to one of various devices such as a computer, a portable computer, an ultra mobile PC (UMPC), a workstation, a net-book, a PDA, a web tablet, a wireless phone, a mobile phone, a smart phone, a digital camera, a digital audio recorder, a digital audio player, a digital picture recorder, a digital picture player, a digital video recorder, a digital video player, a device that can transmit/receive data in a wireless environment and a user device constituting a home network.

Figure 15:
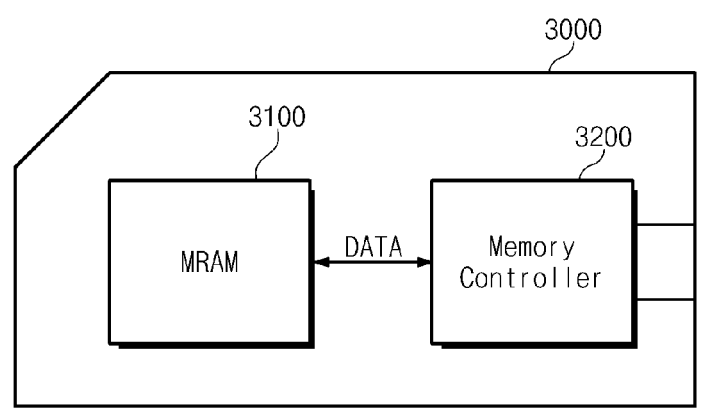
FIG. 15 is a block diagram illustrating an exemplary memory card in accordance some embodiments.

FIG. 15 is a block diagram illustrating an exemplary memory card in accordance some embodiments. Referring to FIG. 15, a memory card 3000 may include a magnetic random access memory (MRAM) 3100 and a memory controller 3200. The memory controller 3200 can control the MRAM 3100 on the basis of control signals received from the outside.

In the memory card 3000 described above, the MRAM 3100 may operate in the same manner as any one of the nonvolatile memory devices described in FIGS. 1 and 2. The MRAM 3100 includes an SPO detection circuit sensing sudden power off independently from the memory controller 3200. In certain embodiments, the SPO detection circuit may be the same as any one of the SPO detection circuits described in FIGS. 3 and 10. A sensing circuit included in the SPO detection circuit is programmed to have a different program state according to whether sudden power off occurs or not. Thus, the MRAM 3100 can judge whether sudden power off occurs or not by reading out a program state of the sensing cell.

The MRAM 3100 senses sudden power off of the nonvolatile memory device independently from a host or the memory controller 3200, load of the host or the memory controller 3200 is reduced and the MRAM 3100 can judge more quickly whether sudden power off occurs or not.

The memory card 3000 can constitute a memory card device, an SSD device, a multimedia card device, an SD card, a memory stick device, a hard disk drive device, a hybrid drive device or a general-purpose serial bus flash device. For example, the memory card 3000 can constitute a card satisfying an industrial standard for using a user device such as a personal computer.

Figure 16:
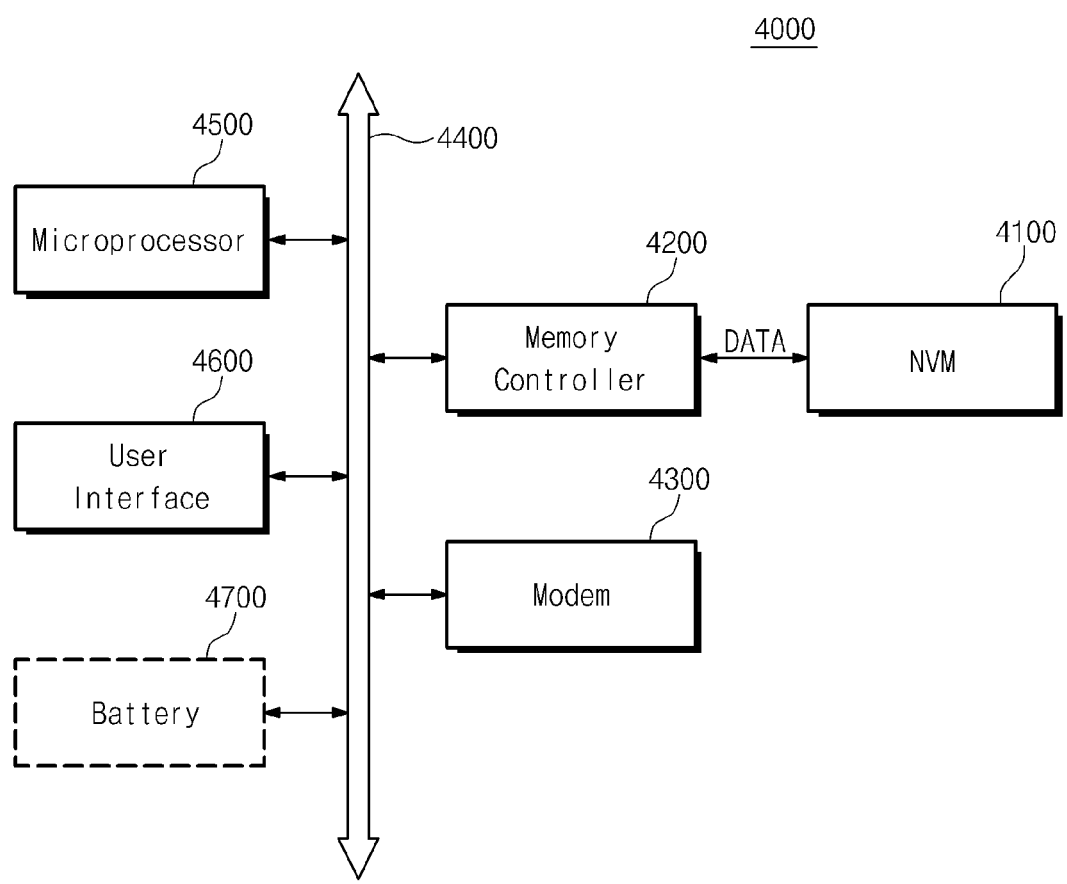
FIG. 16 is a block diagram illustrating an exemplary memory system and a computing system including the memory system in accordance some embodiments.

FIG. 16 is a block diagram illustrating a memory system and a computing system including the memory system in accordance some exemplary embodiments. Referring to FIG. 16, a computing system 4000 may include a nonvolatile memory device, a memory controller 4200, a modem 4300 such as a baseband chipset, a microprocessor 4500 and a user interface 4600 that are electrically connected to a bus 4400.

In the computing system 4000 of FIG. 16, the nonvolatile memory device 4100 may operate in the same manner as one of the nonvolatile memory devices described in FIGS. 1 and 2. The nonvolatile memory device 4100 may be, for example, a magnetic random access memory (MRAM).

In the computing system 4000 described above, the nonvolatile memory device 4100 includes an SPO detection circuit sensing sudden power off independently from the memory controller 4100. In certain embodiments, the SPO detection circuit may be the same as any one of the SPO detection circuits described in FIGS. 3 and 10. A sensing circuit included in the SPO detection circuit is programmed to have a different program state according to whether sudden power off occurs or not. Thus, the nonvolatile memory device 4100 can judge whether sudden power off occurs or not by reading out a program state of the sensing cell.

The nonvolatile memory device 4100 can detect sudden power off of the nonvolatile memory device independently from a host or memory controller 4200. Thus, load of the host or the memory controller 4200 is reduced and the nonvolatile memory device 4100 can judge more quickly whether sudden power off occurs or not.

In the case where the computing system 4000 is a mobile device, a battery 4700 for supplying an operation voltage of the computing system may additionally be provided. Although not illustrated in the drawing, the computing system 4000 may further include an application chipset, a camera image processor (CIS), a mobile DRAM, etc. The memory controller 4200 and the nonvolatile memory device 4100 may constitute a solid state disk (SSD) using a nonvolatile memory device when storing data.

The nonvolatile memory device and/or the memory controller may be mounted using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

The above-disclosed subject matter is to be considered illustrative, and not restrictive, and the appended claims are intended to cover all such modifications, enhancements, and other embodiments, which fall within the true spirit and scope of the inventive concept. Thus, the scope of the inventive concept is to be determined by the broadest permissible interpretation of the following claims and their equivalents, and should not be restricted or limited by the foregoing detailed description.

What is claimed is:

1. A nonvolatile memory device comprising:
   a memory cell array comprising a plurality of memory cells connected to a plurality of bit lines and a plurality of word lines;
   a word line decoder configured to apply word line voltages to the plurality of word lines;
   a bit line selector configured to select at least one bit line of the plurality of bit lines;
   a control logic configured to control the word line decoder and the bit line selector so that write data is programmed in the memory cell array; and
   a sudden power off (SPO) detection circuit, wherein the SPO detection circuit comprises:
a sensing cell;
a first driver configured to provide a first voltage to the sensing cell; and
a second driver configured to provide a second voltage to the sensing cell,
wherein a program state of the sensing cell becomes different depending on an order or a time difference between the first driver and the second driver being powered off.

2. The nonvolatile memory device of claim 1, wherein the SPO detection circuit is configured such that when sudden power off occurs in the nonvolatile memory device, the first driver and the second driver are sequentially powered off at time intervals shorter than a reference time or are powered off at the same time.

3. The nonvolatile memory device of claim 2, wherein the SPO detection circuit is configured such that when normal power off occurs in the nonvolatile memory device, the first driver and the second driver are sequentially powered off at time intervals longer than the reference time.

4. The nonvolatile memory device of claim 3, wherein the SPO detection circuit is configured such that when the sudden power off occurs, the sensing cell is programmed to a first program state and when the normal power off occurs, the sensing cell is programmed to a second program state different from the first program state.

5. The nonvolatile memory device of claim 4, wherein the SPO detection circuit further comprises:
at least one comparison cell which is programmed to the first program state or the second program state by a control of the first driver and the second driver; and
wherein the SPO detection circuit is configured to compare program states of the sensing cell and the comparison cell and to judge whether the nonvolatile memory device is suddenly powered off or not according to the comparison result.

6. The nonvolatile memory device of claim 4, wherein the SPO detection circuit further comprises:
a delay unit connected between the first driver and the sensing cell and configured to delay a voltage transfer from the first driver to the sensing cell;
wherein the SPO detection circuit is configured to judge whether the nonvolatile memory device is suddenly powered off according to a program state of the sensing cell.

7. The nonvolatile memory device of claim 1, wherein the sensing cell comprises:
a memory device; and
a switch transistor serially connected to one end of the memory device.

8. The nonvolatile memory device of claim 7, wherein the memory device comprises:
a first magnetic layer;
a second magnetic layer; and
a tunnel junction layer inserted between the first and second magnetic layers.

9. The nonvolatile memory device of claim 7, wherein the SPO detection circuit is configured to receive the first voltage at a gate terminal of the switch transistor and the second voltage at the other end of the memory device.

10. The nonvolatile memory device of claim 9, further comprising:
a first logic controlling the first driver to change a level of the first voltage; and
a second logic controlling the second driver to change a level of the second voltage.

11. The nonvolatile memory device of claim 10, wherein the first logic is included in the word line decoder and the second logic is included in the bit line selector.

12. The nonvolatile memory device of claim 1, wherein the sensing cell is included in the memory cell array.

13. A sudden power off detection method for a nonvolatile memory device including a sudden power off (SPO) detection circuit comprising a sensing cell storing sensing data, a first driver providing a first voltage to the sensing cell, and a second driver providing a second voltage to the sensing cell, the method comprising:
receiving a sudden power off detection command;
reading out the sensing data from the SPO detection circuit in response to the sudden power off detection command; and
judging whether sudden power off occurs or not according to the sensing data read out,
wherein a value of the sensing data depends on the order or a time difference between the first and second drivers being powered off.

14. The sudden power off detection method of claim 13, wherein the SPO detection circuit further comprises at least one comparison cell, and
wherein judging whether sudden power off occurs or not comprises:
comparing whether data stored in the comparison cell is identical to the sensing data; and
judging whether sudden power off occurs or not according to the comparison result.

15. The sudden power off detection method of claim 13, further comprising:
delaying a voltage transfer from the first driver to the sensing cell using a delay unit, and
judging whether sudden power off occurs or not according to a value of the sensing data.

16. A nonvolatile memory device comprising:
a memory cell array comprising a plurality of memory cells connected to a plurality of bit lines and a plurality of word lines;
a word line decoder configured to apply word line voltages to the plurality of word lines;
a bit line selector configured to select at least one bit line of the plurality of bit lines;
a control logic configured to control the word line decoder and the bit line selector so that write data is programmed in the memory cell array; and
a sudden power off (SPO) detection circuit,
wherein the SPO detection circuit is configured to:
set itself to a first state when a normal power off occurs, and
set itself to a second state different from the first state when a sudden power off occurs.

17. The nonvolatile memory device of claim 16, wherein:
the SPO detection circuit includes a first input for receiving a first signal from a first voltage source and a second input for receiving a second signal from a second voltage source,
the normal power off includes reducing the voltage applied at the first input and reducing the voltage applied at the second input in a controlled manner, and
the sudden power off includes reducing the voltage applied at the first input and reducing the voltage applied at the second input in an uncontrolled manner.

18. The nonvolatile memory device of claim 17, wherein:
the first state occurs when at least a predetermined amount of time passes between the voltage applied at the first input being reduced and the voltage applied at the second input being reduced; and the second state occurs when less than the predetermined amount of time passes between the voltage applied at the first input being reduced and the voltage applied at the second input being reduced.

19. The nonvolatile memory device of claim 16, wherein the SPO detection circuit comprises:
   a sensing cell;
   a first driver configured to provide a first voltage to the sensing cell; and
   a second driver configured to provide a second voltage to the sensing cell,
   wherein the sensing cell comprises:
      a memory device; and
      a switch transistor serially connected to one end of the memory device.

20. The nonvolatile memory device of claim 19, wherein the memory device comprises:
   a first magnetic layer;
   a second magnetic layer; and
   a tunnel junction layer inserted between the first and second magnetic layers.

\* \* \* \* \*